United States Patent [19]

Katayama et al.

[11] Patent Number: 5,896,066

[45] Date of Patent: *Apr. 20, 1999

[54] PLL SYNTHESIZER HAVING A RESET CIRCUIT

[75] Inventors: Satoshi Katayama; Shinji Saito; Masanori Kishi; Morihito Hasegawa, all of Kasugai, Japan

[73] Assignee: Fujitsu Limited, Kanagawa, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/717,806

[22] Filed: Sep. 24, 1996

[30] Foreign Application Priority Data

Nov. 30, 1995 [JP] Japan ..................... 7-313314
Mar. 14, 1996 [JP] Japan ..................... 8-058005

[51] Int. Cl.$^6$ ................................. H03L 7/089
[52] U.S. Cl. ................. 331/17; 331/1 A; 331/8; 331/25; 327/12; 327/159
[58] Field of Search ................. 331/1 A, 8, 14, 331/15, 16, 17, 25, DIG. 2; 327/107, 156–159, 3, 5, 7, 12

[56] References Cited

U.S. PATENT DOCUMENTS

| | | | |
|---|---|---|---|
| 3,469,198 | 9/1969 | Madsen | 327/12 X |
| 4,105,947 | 8/1978 | Crowley | 327/7 X |
| 4,156,855 | 5/1979 | Crowley | 331/1 A |
| 4,940,952 | 7/1990 | Kegasa | 331/17 X |
| 5,057,793 | 10/1991 | Cowley et al. | 331/14 X |
| 5,095,287 | 3/1992 | Irwin et al. | 331/17 X |
| 5,534,821 | 7/1996 | Akiyama et al. | 331/14 X |

*Primary Examiner*—David Mis
*Attorney, Agent, or Firm*—Nikaido Marmelstein Murray & Oram, LLP

[57] ABSTRACT

A PLL including a phase comparator, a VCO, and a charge pump further includes a reset circuit. The reset circuit detects whether both of the charge pump transistors are in an ON state, and if so, generates a reset signal which inhibits the UP and DOWN signals generated by the phase comparator. The reset circuit includes first and second detection circuits and a signal generating circuit.

10 Claims, 18 Drawing Sheets

Fig.8A  ideal characteristic
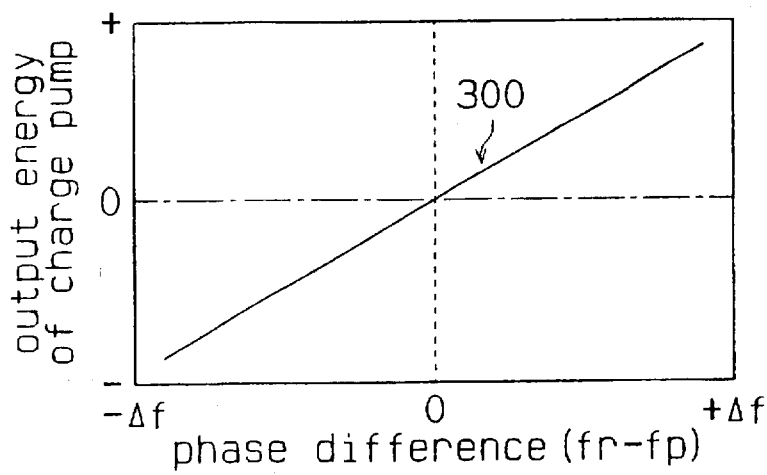
Fig.8B  dead zone characteristic
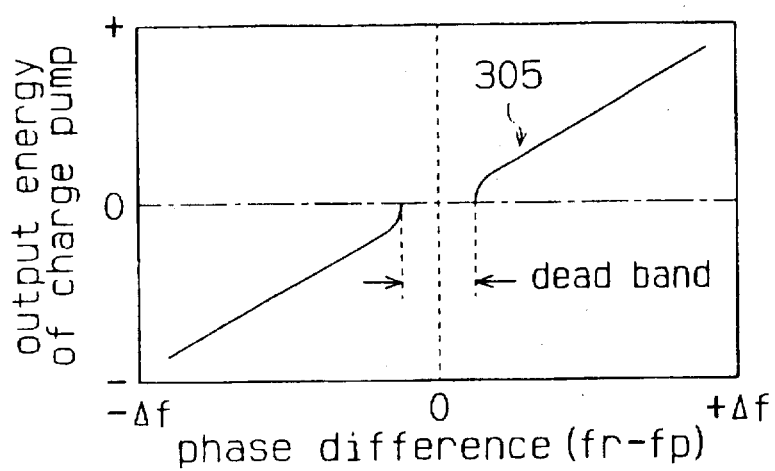
Fig.8C  overlap characteristic
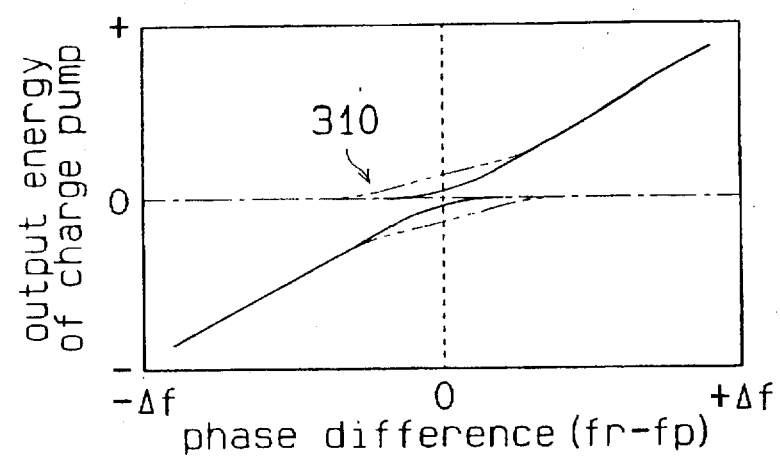

PLL SYNTHESIZER HAVING A RESET CIRCUIT

BACKGROUND OF THE INVENTION

1. Field of the Invention

The present invention relates generally to Phase-Locked Loop (PLL) frequency synthesizers, and more particularly, to PLL frequency synthesizers which operate to decrease the difference between the ideal and the realized output energy of a PLL frequency synthesizer's charge pump circuit, and a method of performing the same.

2. Description of the Related Art

PLL frequency synthesizers are frequently used in mobile communication devices such as portable telephones, cordless telephones, and a variety of other well known applications. A PLL frequency synthesizer generates a comparison signal by frequency-dividing a frequency signal output from a voltage controlled oscillator. Based on the difference between the phase of the comparison signal and the phase of a reference signal, a charge pump circuit outputs a voltage signal. The voltage controlled oscillator outputs a controlled frequency signal in accordance with the voltage signal. The controlled frequency signal from the voltage controlled oscillator is then frequency-divided again, yielding another comparison signal. The PLL frequency synthesizer repeatedly executes this operation to output a frequency signal whose level is locked to some multiplication of the level of the reference signal.

An ideal PLL frequency synthesizer operates such that the output energy of the charge pump circuit is a truly linear function (i.e., linear with no offset) of the phase difference between the reference signal and the output signal. FIG. 8A is a graph of a curve 300 of the ideal PLL frequency synthesizer. The curve 300 plots the output energy along the vertical axis as a function of the phase difference plotted along the horizontal axis.

However, due to delay actually occurring in the charge pump circuit, the realized PLL frequency synthesizer only responds to an absolute phase difference greater than some small, but substantial, amount. As a result, the charge pump circuit has a deadband wherein the output energy is substantially zero regardless of the phase difference, as shown by a curve 305 in FIG. 8B. To prevent the occurrence of such a deadband, the charge pump circuit is generally designed in such a manner that the output energy overlaps near the origin and the phase difference characteristic, although non-linear, no longer has a deadband, as indicated by a two-dot chain line 310 in FIG. 8C.

FIG. 17 shows a conventional PLL frequency synthesizer 200. A reference frequency divider 201 frequency-divides a crystal oscillation signal having a predetermined frequency output from a crystal oscillator (not illustrated) to yield a reference signal fr and outputs the reference signal fr to a phase comparator 203. A comparison frequency divider 202 frequency-divides a frequency signal fv output from a voltage controlled oscillator (VCO) 206 to yield a comparison signal fp and outputs the comparison signal fp to the phase comparator 203.

The phase comparator 203 compares the phase of the reference signal fr with that of the comparison signal fp, and, in response, outputs a first phase difference signal φR and a second phase difference signal φP to a charge pump circuit 204.

As shown in FIG. 18, the charge pump circuit 204 has a pMOS transistor 210 and an nMOS transistor 211 connected in series between a power supply $V_{CC}$ and a ground GND. The drains of the pMOS transistor 210 and the nMOS transistor 211 are connected to an output terminal 212 of the charge pump circuit 204. Low-Pass Filter (LPF) 205, as shown in FIG. 17, is connected to the output terminal 212.

The first phase difference signal φR is input to the gate of the pMOS transistor 210, and the second phase difference signal φP is input to the gate of the nMOS transistor 211. Based on the voltage potentials of the first and second phase difference signals φR and φP, the pMOS transistor 210 and the nMOS transistor 211 are turned either on or off. Hence, the charge pump circuit 204 outputs an analog voltage signal Do from the output terminal 212 based on the first and second phase difference signals φR and φP.

The LPF 205 smoothes the voltage signal Do from the charge pump circuit 204 to yield a control voltage signal $V_T$ having a high frequency component removed therefrom, and outputs this signal $V_T$ to the VCO 206. The VCO 206 outputs the frequency signal fv according to the voltage of the control voltage signal $V_T$. This frequency signal fv is fed back to the comparison frequency divider 202. As this operation is repeatedly and continuously executed, the conventional PLL frequency synthesizer 200 will, theoretically, reach a steady-state where the frequency signal fv of the VCO 206 is locked to a set frequency.

As shown in FIG. 18, the phase comparator 203 has six 2-input NAND gates 221 to 223 and 231 to 233, two 3-input NAND gates 224 and 234, a single 4-input NAND gate 237, three inverters 225, 226 and 235 and a delay circuit 238.

The NAND gate 221 receives the reference signal fr and the output signal, S24, of the NAND gate 224. The NAND gate 221 outputs a signal S21 based on both signals fr and S24. The NAND gate 223 receives the output signal, S22, of the NAND gate 222 as well as the signal S21. The NAND gate 223 outputs a signal S23 based on both signals S21 and S22.

The NAND gate 224 receives the output signal, S38, of the delay circuit 238 as well as the signals S21 and S23. The NAND gate 224 outputs a signal S24 based on the three signals S21, S23 and S38. The inverters 225 and 226 are connected in series to the output terminal of the NAND gate 224, and the inverter 226 outputs the first phase difference signal φR which is in phase with the signal S24.

The NAND gate 222 receives the two signals S23 and S38 and outputs a signal S22 based on both signals S23 and S38. The NAND gate 231 receives the output signal, S34, of the NAND gate 234 as well as the comparison signal fp. The NAND gate 231 outputs a signal S31 based on both signals fp and S34. The NAND gate 233 receives the output signal, S32, of the NAND gate 232 as well as the signal S31. The NAND gate 233 outputs a signal S33 based on both signals S31 and S32.

The NAND gate 234 receives the three signals S31, S33 and S38, and outputs a signal S34 based on those three signals. The inverter 235, which is connected to the output terminal of the NAND gate 234, inverts the signal S34 to output the second phase difference signal φP.

The NAND gate 232 receives the two signals S33 and S38, and outputs a signal S32 based on those two signals. The NAND gate 237 receives the four signals S21, S23, S31 and S33, and outputs a signal S37 based on those signals to the delay circuit 238. The delay circuit 238, which comprises even-numbered inverters connected in series, delays the signal S37 and outputs the signal S38 which in phase with the delayed signal S37.

In the thus constituted phase comparator 203, when the reference signal fr goes low, the signal S21 goes high, based on which the signal S24 goes low, causing the first phase difference signal φR to go low, as shown in FIG. 19. Further, when the reference signal fr goes low, the signal S31 goes high. As a result, after the delay time of the NAND gate 234, the signal S34 goes low and the second phase difference signal φP goes high.

When the signals S21 and S31 go high, the signal S37 goes low. Consequently, the signal S38 goes low after a delay time D1 of the delay circuit 238. The transition of the signal S38 to the low level causes both the signals S24 and S34 to go high. As a result, the first phase difference signal φR goes high and the second phase difference signal φP goes low.

In accordance with the phase difference between the reference signal fr and the comparison signal fp and the delay time D1 of the delay circuit 238, the phase comparator 203 outputs the first and second phase difference signals φR and φP. When the two phase difference signals φR and φP are output as overlapped, the output energy of the charge pump circuit 204 has an overlap non-linear area as indicated by the two-dot chain line 310 in FIG. 8C. Because this overlap non-linear area occurs, the desired ideal phase characteristics of the ideal PLL frequency synthesizer cannot be obtained.

Further, it is difficult to mass-produce semiconductor chips equipped with the aforementioned various elements such that they have uniform quality. Therefore, the delay time D1 of the delay circuit 238 varies from semiconductor chip to semiconductor chip even within a single production run. Still further, when the delay time D1 becomes longer to increase the overlap range, the output waveform of the charge pump circuit becomes larger, thus generating spurious noise.

SUMMARY OF THE INVENTION

The present invention relates to a PLL frequency synthesizer which can make the output energy characteristic of the charge pump circuit considerably close to the ideal characteristic, thereby allowing the frequency of an output frequency signal to be stably locked to a preset frequency.

A PLL frequency synthesizer according to one embodiment of the present invention has a voltage controlled oscillator for transmitting the frequency signal in response to a voltage signal. A comparison frequency divider transmits a comparison signal by dividing the frequency signal from the voltage controlled oscillator. A phase comparator receives both a reference signal having a predetermined frequency and the comparison signal. In response to the reference signal and the comparison signal, the phase comparator transmits a first phase difference signal and a second phase difference signal respectively representative of a phase difference between the reference signal and the comparison signal. A charge pump circuit transmits the voltage signal in response to the first and second phase difference signals. The charge pump circuit has a first transistor activated by with the first phase difference signal and a second transistor activated by with the second phase difference signal. A reset circuit detects conductive conditions of the first and second transistors and terminates the output of the first and second phase difference signals when the reset circuit detects that the first and second transistors are activated.

The present invention also relates to a method for synthesizing an output signal having an output frequency substantially synchronized with a reference frequency of a fixed reference signal. The synthesizing method will decrease a difference between an ideal output energy and a realized output energy of the output signal. The synthesizing method includes steps of: providing the fixed reference signal, providing a comparison signal indicative of the output frequency, and generating a first phase difference signal and a second phase difference signal in response to the fixed reference signal, the comparison signal, and a reset signal. The first and second phase signals and the reset signal are each capable of taking a LOW and a HIGH state. When the reset signal is HIGH, the first phase difference signal is forced to a HIGH state. However, when the reset signal is LOW, the first phase difference signal corresponds to a phase difference between the fixed reference signal and the comparison signal when a phase of the fixed reference signal leads a phase of the comparison signal. Similarly, when the reset signal is HIGH, the second phase difference signal is forced to a LOW state. However, when the reset signal is LOW, the second phase difference signal corresponds to a phase difference between the fixed reference signal and the comparison signal when the comparison signal phase leads the fixed reference signal phase. The synthesizing method further includes the steps of: setting the reset signal HIGH when the first phase difference signal is LOW and the second phase difference signal is HIGH, exciting a charge pump with the first and second phase difference signals thereby generating an analog control signal VT, and generating the output signal in response to the analog control signal VT, the output frequency associated with a magnitude of the analog control signal VT. Further, the method may continuously perform the above-mentioned steps so that the output signal reaches a steady-state in which the output frequency is substantially synchronized with the frequency of the reference signal.

BRIEF DESCRIPTION OF THE DRAWINGS

The invention, together with further advantages thereof, may best be understood by reference to the following description taken in conjunction with the accompanying drawings in which:

FIGS. 8A–8C presents graphs showing phase characteristics of a few different PLL frequency synthesizers, namely, FIG. 8A shows the ideal characteristics, FIG. 8B shows the deadband characteristics, and FIG. 8C shows the non-linear overlapping characteristics;

DETAILED DESCRIPTION OF THE PREFERRED EMBODIMENTS

A PLL frequency synthesizer according to a first embodiment of the present invention will be now described with reference to FIGS. 1 through 5.

Figure 1:
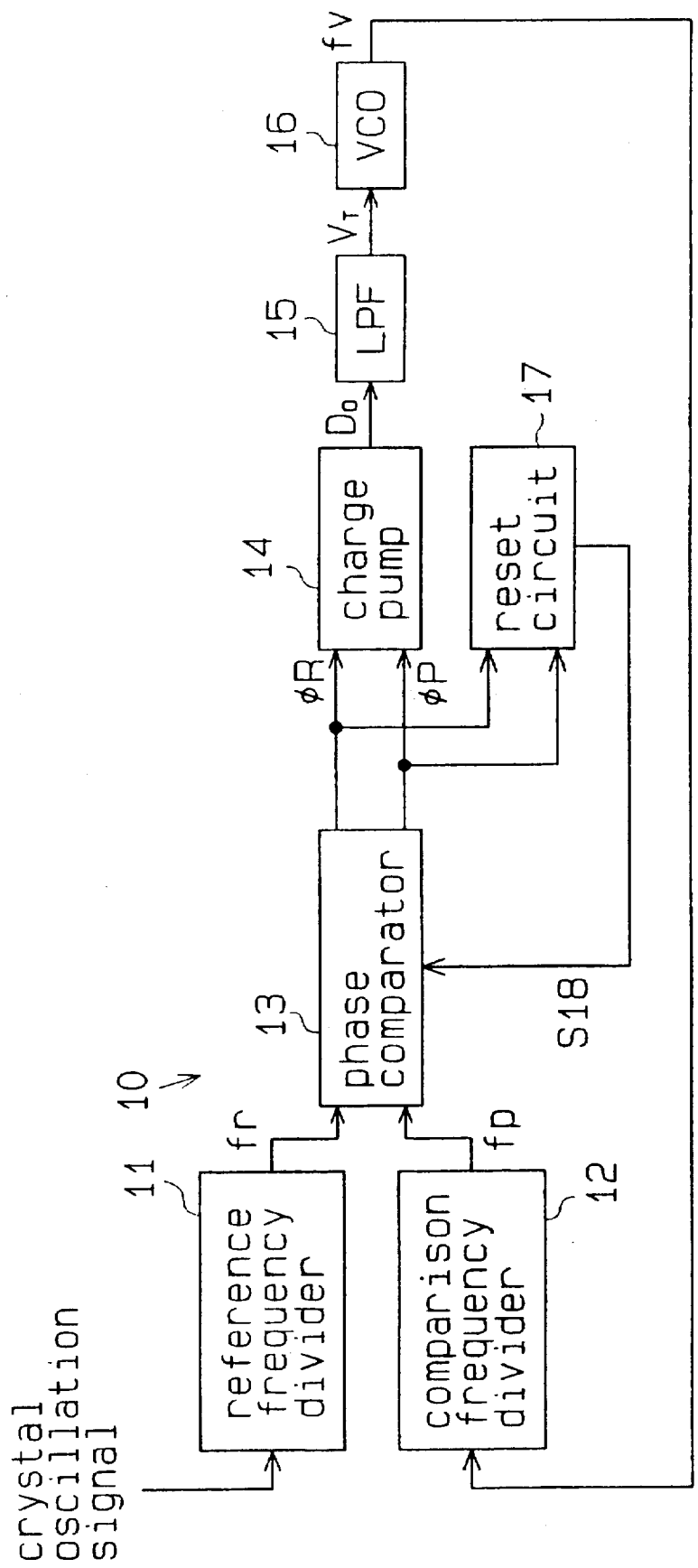
FIG. 1 is a block diagram of a PLL frequency synthesizer according to a first embodiment of the present invention.

FIG. 1 illustrates a PLL frequency synthesizer 10 according to the first embodiment. The PLL frequency synthesizer 10 comprises a reference frequency divider 11, a comparison frequency divider 12, a phase comparator 13, a charge pump circuit 14, a low-pass filter (LPF) 15, a voltage controlled oscillator (VCO) 16 and a reset circuit 17. The reference frequency divider 11, the comparison frequency divider 12, the phase comparator 13, the charge pump circuit 14 and the reset circuit 17 are preferably formed on a single semiconductor chip. Although not shown in FIG. 1, the PLL frequency synthesizer 10 is connected to a high-potential power supply $V_{CC}$ as an operation power supply and a ground GND as a low-potential power supply.

The reference frequency divider 11 frequency-divides a crystal oscillation signal having a predetermined frequency to yield a reference signal fr and outputs this reference signal fr to the phase comparator 13. The comparison frequency divider 12 receives frequency setting data and a channel switch signal. The comparison frequency divider 12 frequency-divides a frequency signal fv output from the VCO 16 based on the frequency setting data to yield a comparison signal fp, and outputs the comparison signal fp to the phase comparator 13.

The phase comparator 13 compares the phase of the reference signal fr with that of the comparison signal fp, and outputs a first phase difference signal φR and a second phase difference signal φP to the charge pump circuit 14 based on the comparison result. The first phase difference signal φR corresponds to the phase difference between the reference signal fr and the comparison signal fp when the phase of the reference signal fr leads the phase of the comparison signal fp, and the second phase difference signal φP corresponds to the phase difference between the reference signal fr and the comparison signal fp when the phase of the comparison signal fp leads the phase of the reference signal fr.

Figure 2:
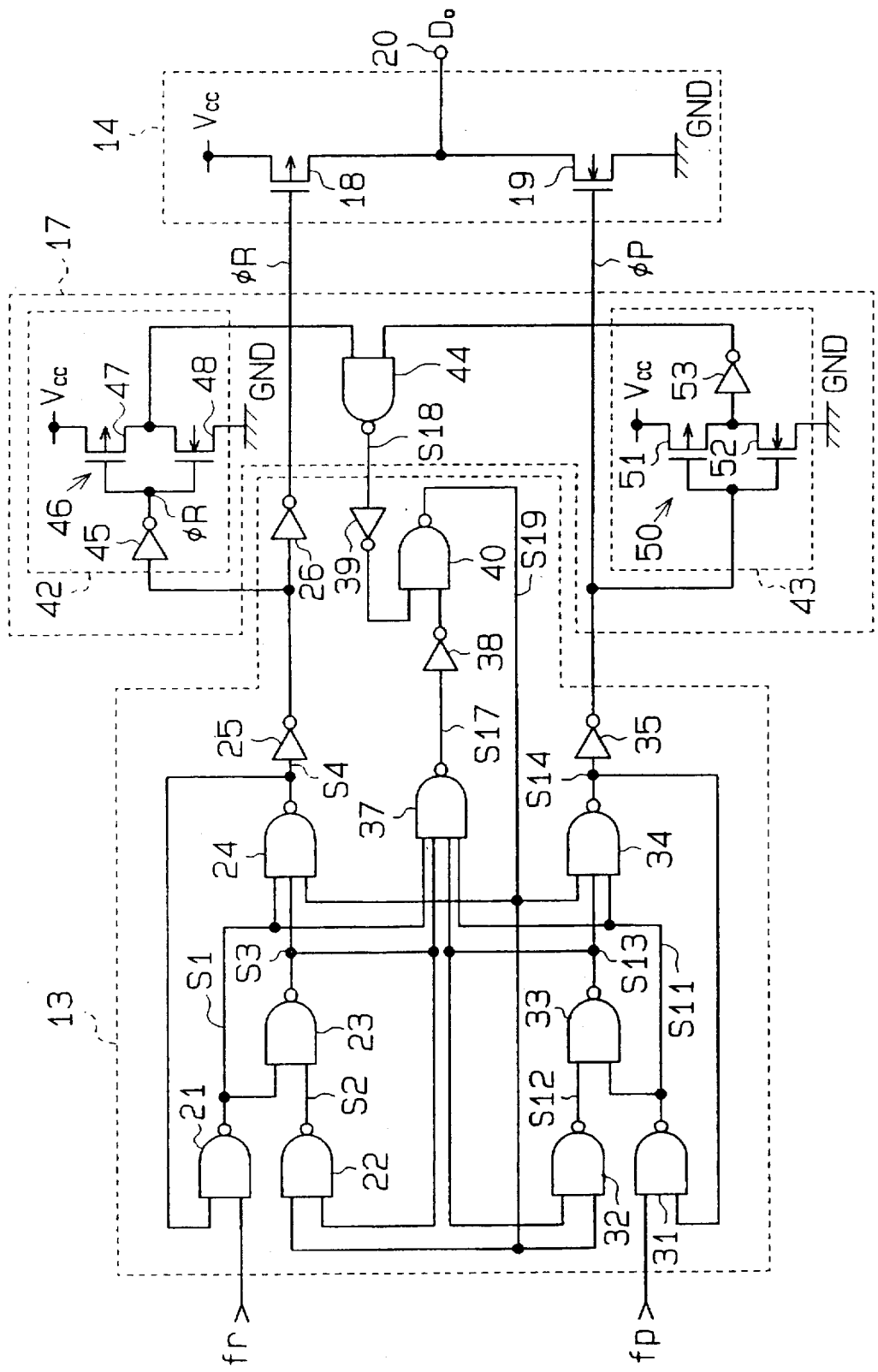
FIG. 2 is a circuit diagram showing in more detail suitable embodiments of a phase comparator, a charge pump, and a reset circuit illustrated in FIG. 1.

As shown in FIG. 2, the charge pump circuit 14 comprises a pMOS transistor 18 as a first transistor and an nMOS transistor 19 as a second transistor, both connected in series between the power supply $V_{CC}$ and the ground GND. The drains of the pMOS transistor 18 and the nMOS transistor 19 are connected to an output terminal 20. The input of the LPF 15 shown in FIG. 1 is connected to the output terminal 20.

The first phase difference signal φR is input to the gate of the pMOS transistor 18, and the second phase difference signal φP is input to the gate of the nMOS transistor 19. Based on the voltage potentials of the first and second phase difference signals φR and φP, the pMOS transistor 18 and the nMOS transistor 19 are turned either on or off, and the charge pump circuit 14 outputs an analog voltage signal Do from the output terminal 20.

The LPF 15 in FIG. 1 smoothes the voltage signal Do from the charge pump circuit 14 to yield a control voltage signal $V_T$ having a high frequency component removed therefrom, and outputs the control voltage signal $V_T$ to the VCO 16. The VCO 16 outputs a frequency signal fv according to the voltage of the control voltage signal $V_T$, and this frequency signal fv is fed back to the comparison frequency divider 12. As this operation is repeatedly performed, the PLL frequency synthesizer 10 reaches a steady-state in which the frequency signal fv of the VCO 16 is locked to the desired set frequency.

As shown in FIG. 2, the phase comparator 13 has seven 2-input NAND gates 21 to 23, 31 to 33 and 40, two 3-input NAND gates 24 and 34, a single 4-input NAND gate 37, and five inverters 25, 26, 35, 38 and 39.

The NAND gate 21 receives the reference signal fr and the output signal, S4, of the NAND gate 24. The NAND gate 21 outputs a signal S1 based on both signals fr and S4. The NAND gate 23 receives the output signal, S2, of the NAND gate 22 as well as the signal S1, and outputs a signal S3 based on both signals S1 and S2.

The NAND gate 24 receives the output signal, S19, of the NAND gate 40 as well as the signals S1 and S3. The NAND gate 24 outputs a signal S4 based on the three signals S1, S3 and S19. The inverters 25 and 26 are connected in series to the output terminal of the NAND gate 24, and the inverter 26 outputs the first phase difference signal φR which is in phase with the signal S4.

The NAND gate 22 receives the two signals S3 and S19, and outputs a signal S2 based on both signals S3 and S19. The NAND gate 31 receives the output signal, S14, of the NAND gate 34 as well as the comparison signal fp, and outputs a signal S11 based on both signals fp and S14. The NAND gate 33 receives the output signal, S12, of the NAND gate 32 as well as the signal S11. The NAND gate 33 outputs a signal S13 based on both signals S11 and S12.

The NAND gate 34 receives the three signals S11, S13 and S19, and outputs a signal S14 based on those three signals. The inverter 35, which is connected to the output terminal of the NAND gate 34, inverts the signal S14 to yield the second phase difference signal φP.

The NAND gate 32 receives the two signals S13 and S19, and outputs a signal S12 based on those two signals. The NAND gate 37 receives the four signals S1, S3, S11 and S13, and outputs a signal S17 based on those signals to the NAND gate 40 via the inverter 38. Therefore, the reference signal fr and the comparison signal fp, both input to the phase comparator 13, generate the first and second phase difference signals φR and φP from the phase comparator 13 while maintaining the phase difference between the signals fr and fp.

The reset circuit 17 in FIG. 1 detects the conductive states of the pMOS transistor 18 and nMOS transistor 19 of the charge pump circuit 14, and stops the first phase difference signal φR from generating a low level signal and the second phase difference signal φP from generating a high level signal when detecting that both transistors 18 and 19 are turned on.

The reset circuit 17 has a first detector 42, a second detector 43 and a 2-input NAND gate 44. The NAND gate 44 operates as a signal generator. The first detector 42 comprises an inverter 45 and an inverter 46 as a first CMOS circuit. The inverter 45 is connected in parallel to the inverter 26 with respect to the inverter 25 in the phase comparator 13. Therefore, the output of the inverter 45 in the first detector 42 becomes the same as the first phase difference signal φR.

The CMOS inverter 46 comprises a pMOS transistor 47 and an nMOS transistor 48, which are connected in series between the power supply $V_{CC}$ and the ground GND. The pMOS transistor 47 constitutes a first detection transistor.

The first phase difference signal φR is input to the gates of the pMOS transistor 47 and the nMOS transistor 48. The size (i.e., current gain) of the pMOS transistor 47 is equal to that of the pMOS transistor 18 in the charge pump circuit 14, and the size of the nMOS transistor 48 is equal to that of the nMOS transistor 19 in the charge pump circuit 14.

When the first phase difference signal φR becomes low, therefore, the pMOS transistor 47 is turned on and the nMOS transistor 48 is turned off, causing the output signal of the inverter 46 to go high. Because the pMOS transistor 47 is turned on at this time substantially at the same time as the pMOS transistor 18 is turned on, it is possible to detect the turn-ON action of the pMOS transistor 18 in the charge pump circuit 14 by detecting the ON state of the pMOS transistor 47.

The second detector 43 comprises an inverter 53 and an inverter 50 as a second CMOS circuit. The inverter 50 comprises a pMOS transistor 51 and an nMOS transistor 52, which are connected in series between the power supply $V_{CC}$ and the ground GND. The nMOS transistor 52 constitutes a second detection transistor.

The second phase difference signal φP is input to the gates of the pMOS transistor 51 and the nMOS transistor 52. The size of the pMOS transistor 51 is equal to that of the pMOS transistor 18 in the charge pump circuit 14, and the size of the nMOS transistor 52 is equal to that of the nMOS transistor 19 in the charge pump circuit 14.

When the second phase difference signal φP goes high, therefore, the pMOS transistor 51 is turned off and the nMOS transistor 52 is turned on, causing the output signal of the inverter 50 to go low. Because the nMOS transistor 52 is turned on substantially at the same time as the nMOS transistor 19 is turned on, it is possible to detect the turn-ON action of the nMOS transistor 19 in the charge pump circuit 14 by detecting the ON state of the nMOS transistor 52.

The output signal of the inverter 50 in the second detector 43 is inverted by the inverter 53 and is then sent to the NAND gate 44. The NAND gate 44 sends out a reset signal S18 to the NAND gate 40 via the inverter 39. This reset signal S18 serves to inhibit the first phase difference signal φR from generating a low level signal and the second phase difference signal φP from generating a high level signal, based on the output signals of the first and second detectors 42 and 43. When the output signals of the first and second detectors 42 and 43 both go high, i.e., when it is detected that the pMOS transistor 18 and nMOS transistor 19 in the charge pump circuit 14 are both turned on, the NAND gate 44 outputs the low level reset signal S18 to reset the NAND gates 24 and 34.

The NAND gate 40 in the phase comparator 13 outputs the signal S19 based on the signal S17 and the reset signal S18. When the signal S17 and the reset signal S18 both go low, the NAND gate 40 output, signal S19, goes low. When the signal S19 goes low, the output signals S4 and S14 of the NAND gates 24 and 34 both go high, so that the first phase difference signal φR goes high and the second phase difference signal φP goes low.

The function of the PLL frequency synthesizer 10 will be now explained with reference to FIGS. 3 through 5.

Figure 3:
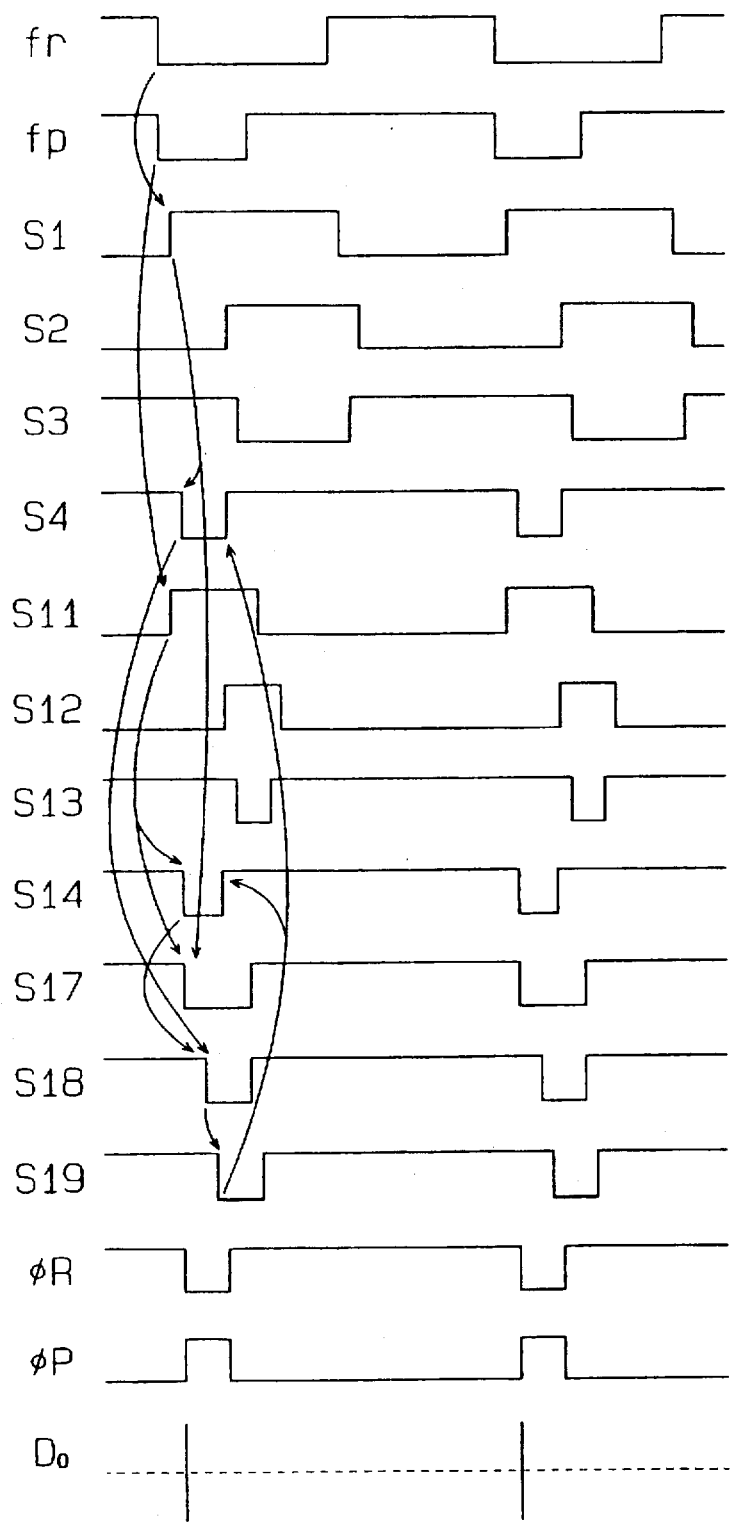
FIG. 3 is a timing diagram for the phase comparator in FIG. 2.

FIG. 3 shows a timing diagram for the synthesizer 10 when the phase of the reference signal fr matches with the phase of the comparison signal fp. When the reference signal fr goes low, the signal S1 goes high, based on which the signal S4 goes low, causing the first phase difference signal φR to go low.

When the comparison signal fp goes low, the signal S11 goes high, based on which the signal S14 goes low, causing the second phase difference signal φP to go high.

Accordingly, the pMOS transistor 18 of the charge pump circuit 14 is turned on based on the first phase difference signal φR being low, and the nMOS transistor 19 is turned on based on the second phase difference signal φP being high.

When the signals S1 and S11 both go high, the signal S17 goes low. At this time, the pMOS transistor 47 is turned on based on the output signal S4 being low, at the same time as the pMOS transistor 18 is turned on, causing the output signal of the first detector 42 to go high.

Based on the output signal S14 being high, the nMOS transistor 52 is turned on at the same time as the nMOS transistor 19 is turned on, causing the output signal of the second detector 43 to go high. As a result, the reset signal S18 goes to a low level after a delay equal to the sum of the delay times of the first and second detectors 42 and 43 and the delay time of the NAND gate 44.

Then, the signal S19 goes low and the signals S4 and S14 both go high. Consequently, the first phase difference signal φR goes high and the second phase difference signal φP goes low. The pMOS transistor 18 is turned off based on the first phase difference signal φR being high, and the nMOS transistor 19 is turned off based on the second phase difference signal φP being low. At this time, the two phase difference signals φP and φR are enabled or disabled at the same time. Therefore, the operation times of the two transistors 18 and 19 overlap each other and the output voltage Do does not change.

When the signal S19 goes low, the signals S2 and S12 go high, so that the signals S3 and S13 go low. When the comparison signal fp goes high, the signal S11 goes low, based on which the signal S13 goes high and the signal S12 goes low. When the reference signal fr goes high, the signal S1 goes low, based on which the signal S3 goes high and the signal S2 goes low.

Figure 4:
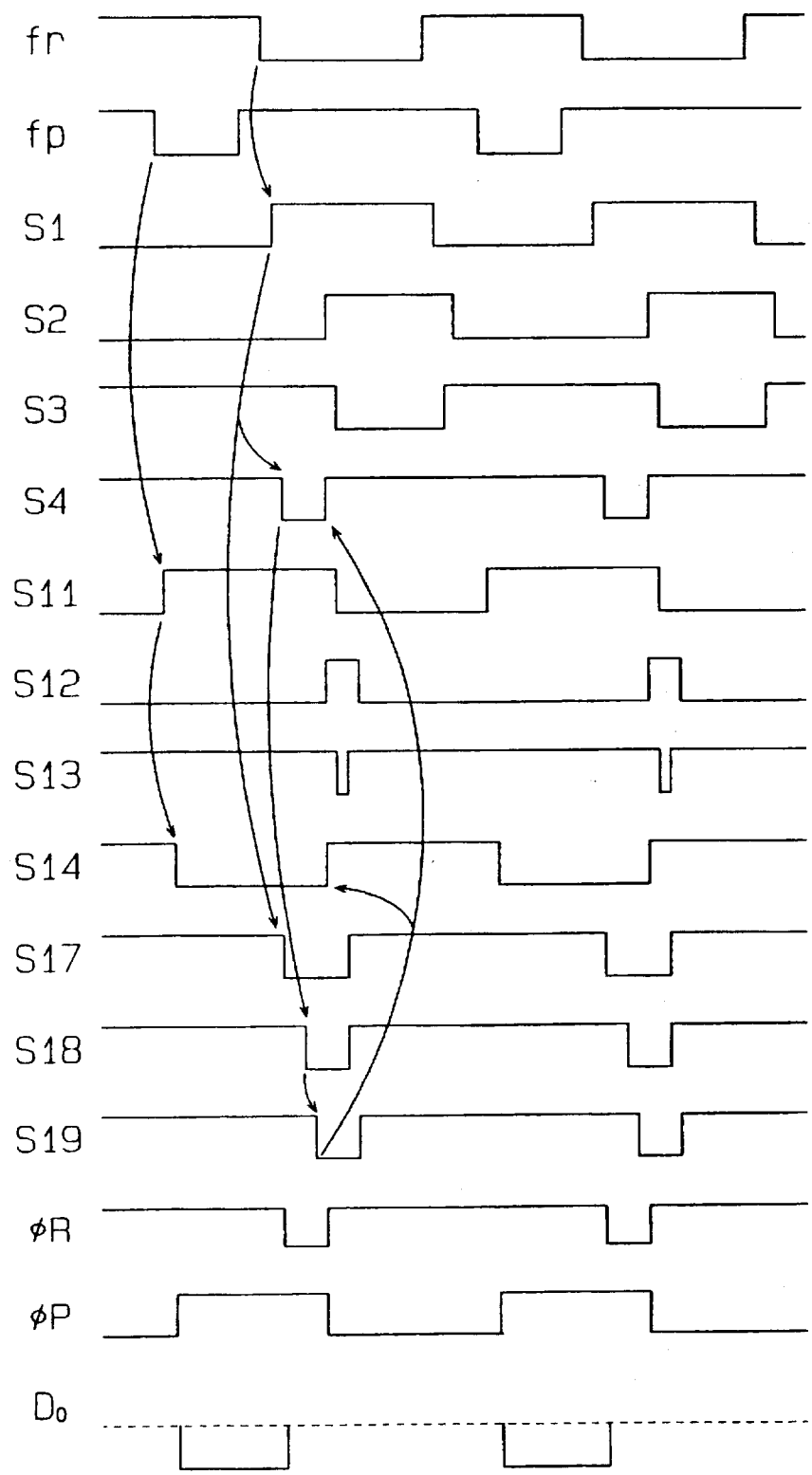
FIG. 4 is a timing diagram for the phase comparator in FIG. 2.

A description will be now given of the case where the phase of the comparison signal fp leads to the phase of the reference signal fr with reference to FIG. 4, which is a timing diagram of such a case. When the comparison signal fp goes low, the signal S11 goes high, based on which the signal S14 goes low and the second phase difference signal φP goes high.

The nMOS transistor 19 is turned on based on the second phase difference signal φP being low, and simultaneously, the nMOS transistor 52 is turned on based on the output signal S14 being high, causing the output signal of the second detector 43 to go high.

When the reference signal fr goes low thereafter, the signal S1 goes high, based on which the signal S4 goes low and the first phase difference signal φR goes low.

The pMOS transistor 18 is turned on based on the first phase difference signal φR being low, and simultaneously, the pMOS transistor 47 is turned on based on the output signal S4 being high, causing the output signal of the first detector 42 to go high.

When the signal S1 goes high, the signal S17 goes low. As a result, the reset signal S18 goes low after a delay of the sum of the delay time of the first detector 42 and the delay time of the NAND gate 44.

Then, the signal S19 goes low and the signals S4 and S14 both go high. Consequently, the first phase difference signal $\phi$R goes high and the second phase difference signal $\phi$P goes low. The pMOS transistor 18 is turned off based on the first phase difference signal $\phi$R being high, and the nMOS transistor 19 is turned off based on the second phase difference signal $\phi$P being low. The two phase difference signals $\phi$R and $\phi$P are disabled with the phase difference between the reference signal fr and the comparison signal fp maintained, and the output voltage Do is controlled in accordance with that phase difference. In this case, when the phase of the comparison signal fp leads the phase of the reference signal fr, the voltage of the control voltage signal $V_T$ is dropped to reduce the frequency of the frequency signal fv.

Figure 5:
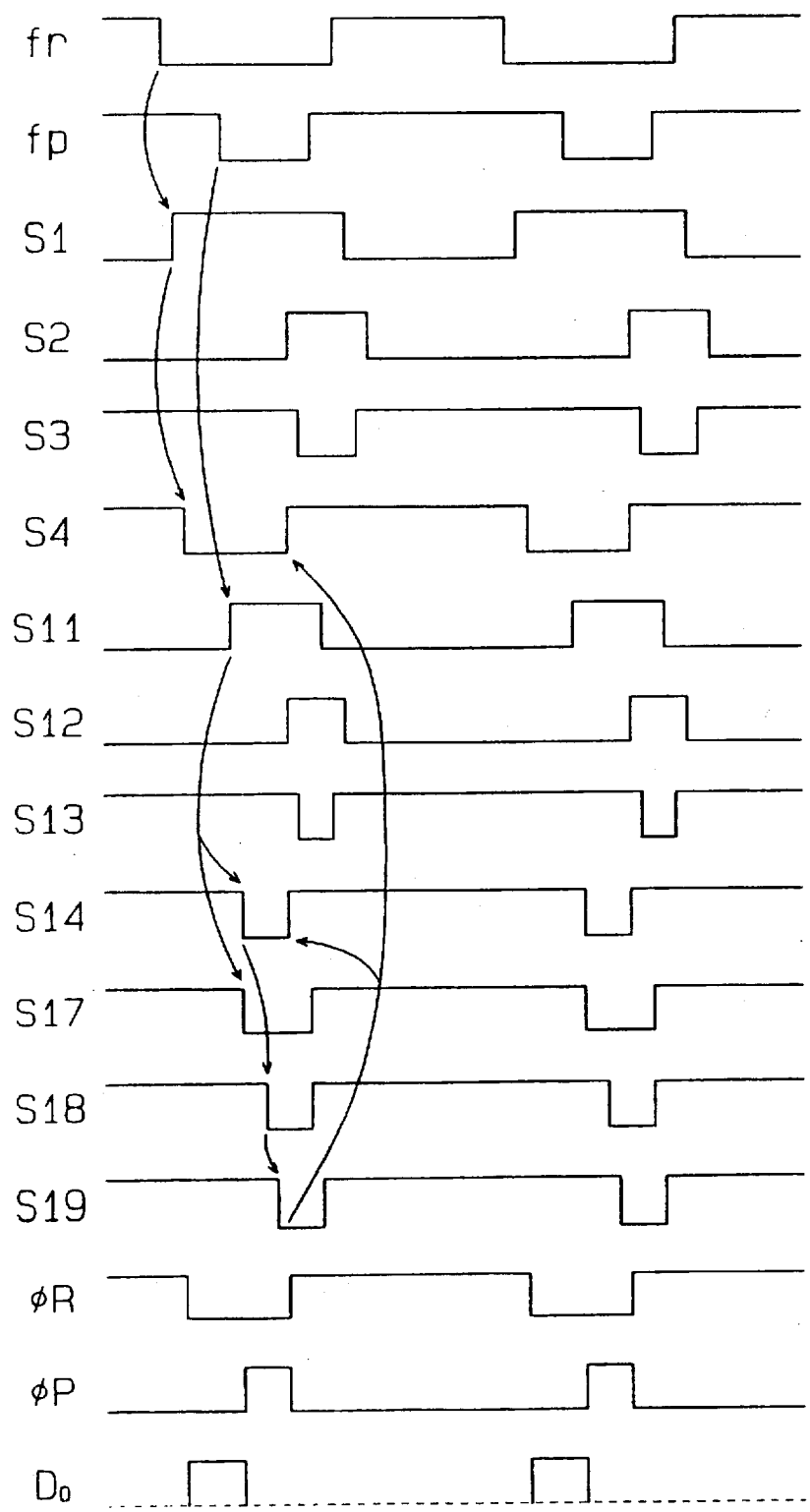
FIG. 5 is a timing diagram for the phase comparator in FIG. 2.

A description will be now given of the case where the phase of the comparison signal fp lags from the phase of the reference signal fr, with reference to FIG. 5. In this case, when the reference signal fr goes low, the signal S1 goes high, based on which the signal S4 goes low and the first phase difference signal $\phi$R goes low.

The pMOS transistor 18 is turned on based on the first phase difference signal $\phi$R being low, and simultaneously, the pMOS transistor 47 is turned on based on the output signal S4 being high, causing the output signal of the first detector 42 to go high.

When the comparison signal fp goes low thereafter, the signal S11 goes high, based on which the signal S14 goes low and the second phase difference signal $\phi$P goes high. The nMOS transistor 19 is turned on based on the second phase difference signal $\phi$P being high, and simultaneously, the nMOS transistor 52 is turned on based on the output signal S14 being high, causing the output signal of the second detector 43 to go high.

When the signal S11 goes high, as mentioned above, the signal S17 goes low. As a result, the reset signal S18 goes low after a delay of the sum of the delay time of the second detector 43 and the delay time of the NAND gate 44. Then, the signal S19 goes low and the signals S4 and S14 both go high. Consequently, the first phase difference signal $\phi$R goes high and the second phase difference signal $\phi$P goes low. The pMOS transistor 18 is turned off based on the first phase difference signal $\phi$R being high, and the nMOS transistor 19 is turned off based on the second phase difference signal $\phi$P being low. The two phase difference signals $\phi$R and $\phi$P are disabled with the phase difference between the reference signal fr and the comparison signal fp maintained, and the output voltage Do is controlled in accordance with that phase difference. In this case, because the phase of the comparison signal fp lags the phase of the reference signal fr, the voltage of the control voltage signal $V_T$ is increased to increase the frequency of the frequency signal fv.

As is apparent from the above, the first embodiment described with reference to FIGS. 1–5 has a number of advantages including the following.

(1) In the first embodiment, when the first detector 42 and the second detector 43 detect that the pMOS transistor 18 and the nMOS transistor 19 of the charge pump circuit 14 are both turned on, the reset circuit 17 outputs the reset signal S18 at a low level to reset both the first phase difference signal $\phi$R to a high level and the second phase difference signal $\phi$P to a low level.

Figure 18:
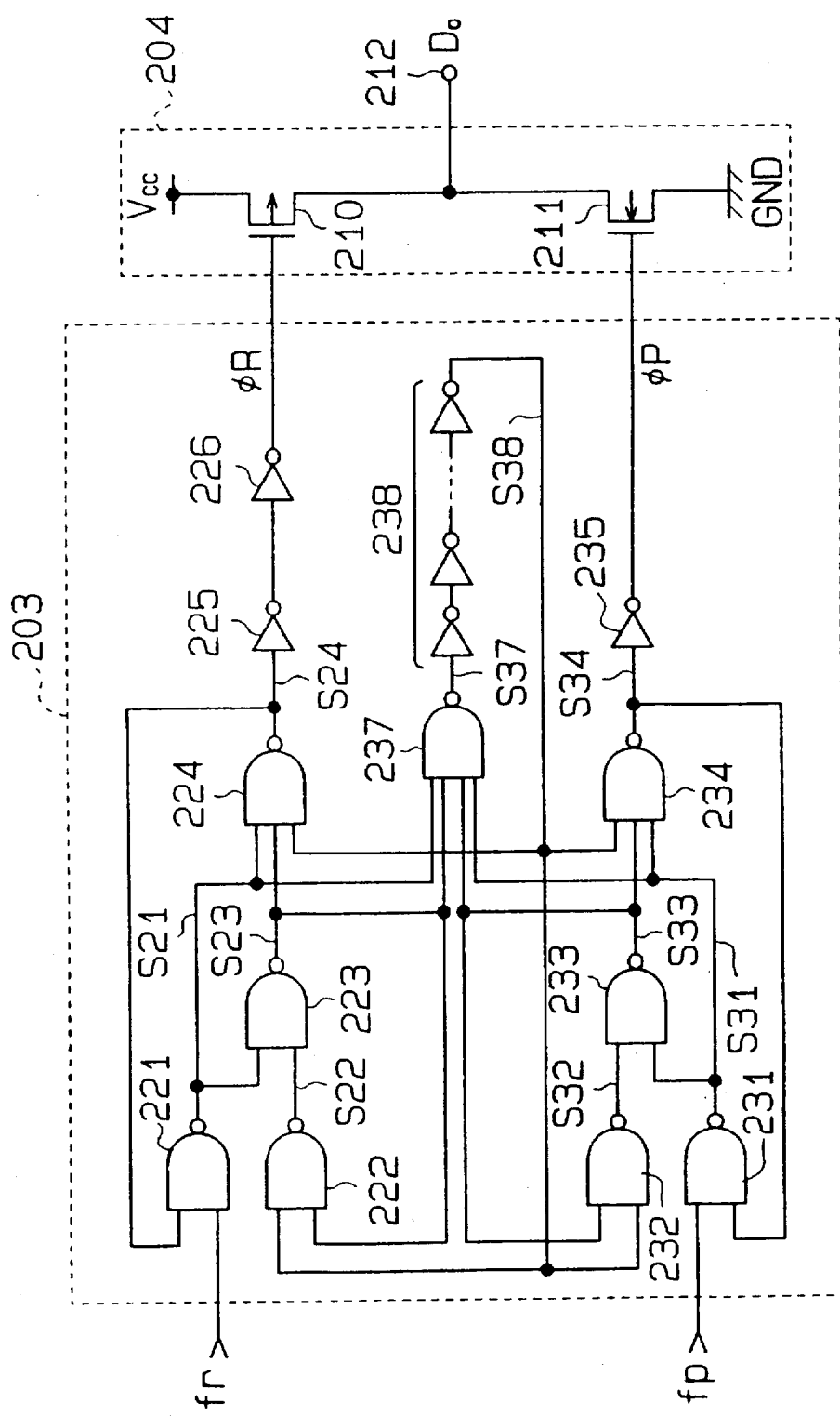
FIG. 18 is a circuit diagram of a phase comparator in FIG. 17.
Figure 19:
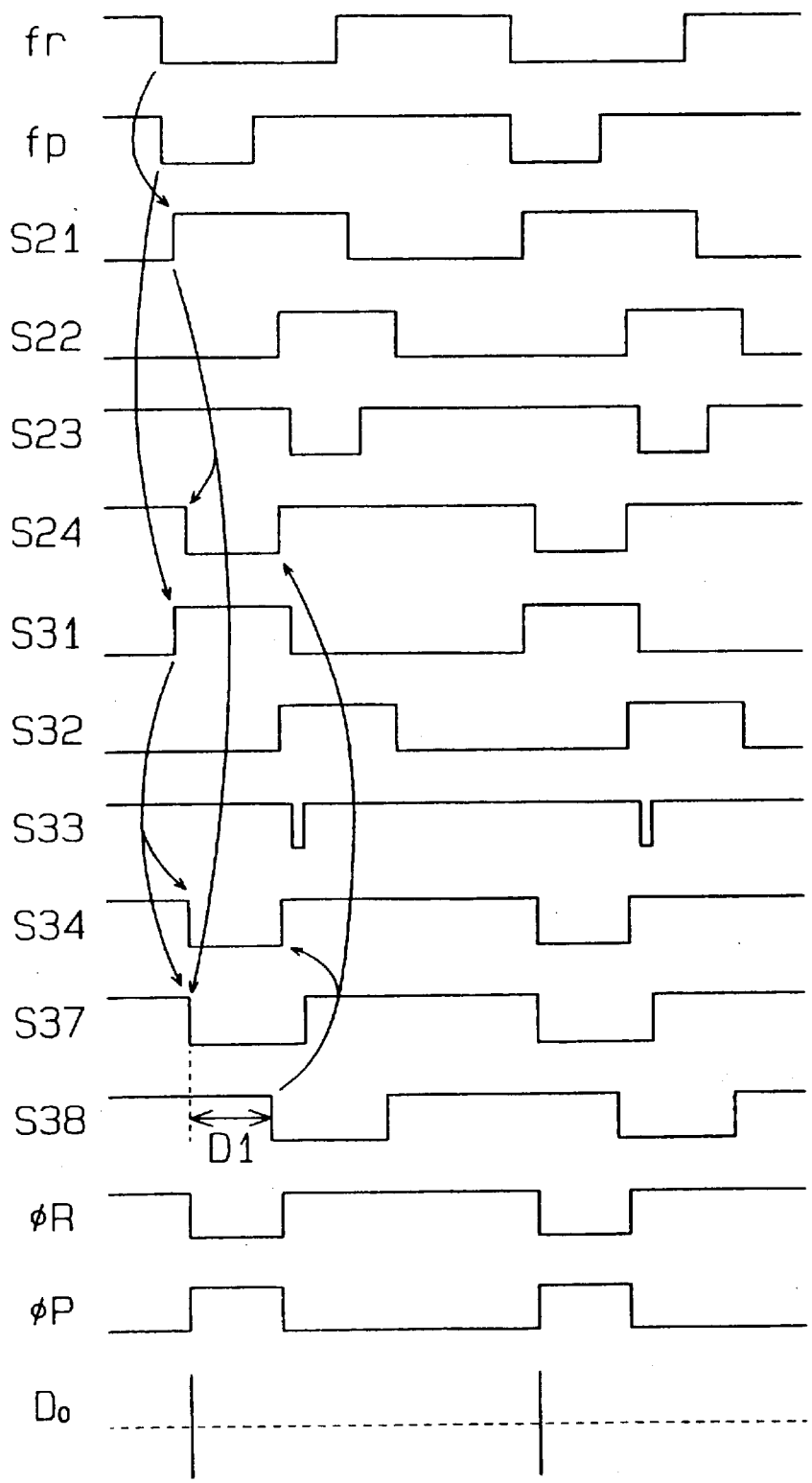
FIG. 19 is a timing diagram for the phase comparator in FIG. 18.

Accordingly, the delay time for the first and second phase difference signals $\phi$R and $\phi$P to reset becomes the sum of the delay times of the first and second detectors 42 and 43, the delay time of the NAND gate 44 and the delay time of the NAND gate 40. Hence, the reset delay time is shorter than the delay time in the prior art (see FIG. 18). It is thus possible to reduce the overlap non-linear area in the output energy of the charge pump circuit 14 as indicated by the solid line 310 in FIG. 8C, and thus the frequency signal fv can be stably locked to the set frequency in a manner which decreases the difference between the ideal output energy of the charge pump circuit so as to more closely follow the ideal characteristic and the realizable output energy of the charge pump circuit so as to more closely follow the ideal characteristic. It is also possible to suppress a variation in the output waveform of the charge pump circuit and the occurrence of spurious noise.

(2) The gate for resetting the first and second phase difference signals $\phi$R and $\phi$P is comprised by a relatively fewer elements, namely, the first and second detectors 42 and 43 and the NAND gates 44 and 40. Therefore, a variation in the precision of manufactured products, if present, does not affect the delay time for the first and second phase difference signals $\phi$R and $\phi$P to be reset, so that the delay time can be set substantially constant.

A second embodiment of the present invention will be now discussed with reference to FIG. 6. To avoid the redundant description, like or same reference numerals are given to those components which are the same as the corresponding components of the first embodiment in FIG. 2.

Figure 6:
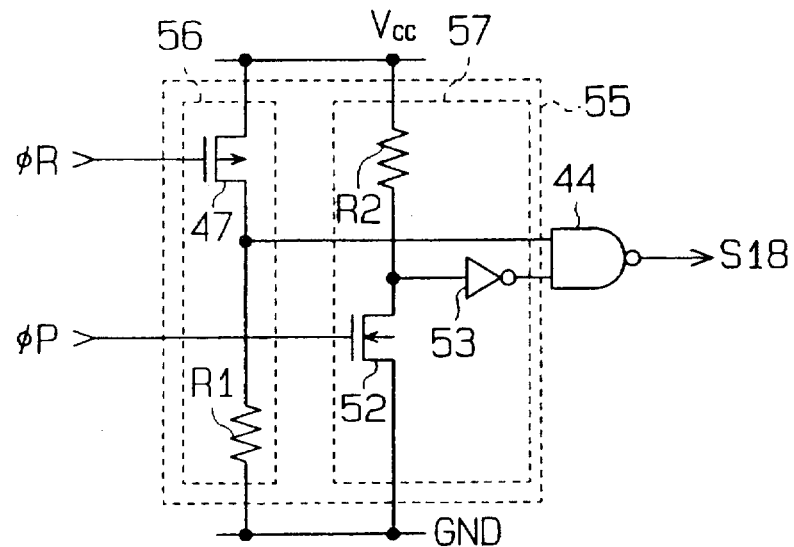
FIG. 6 is a circuit diagram of a reset circuit according to the second embodiment of the present invention.

In the second embodiment illustrated in FIG. 6, another reset circuit 55 is used in the PLL frequency synthesizer 10. The reset circuit 55 comprises a first detector 56, a second detector 57 and the aforementioned 2-input NAND gate 44.

The first detector 56 has a load resistor R1 connected to the pMOS transistor 47 as the first detection transistor, thereby functioning as a first inverter. This first detector 55 differs in this point from the first detector 42 of the first embodiment. The second detector 57 has a load resistor R2 connected to the nMOS transistor 52 as the second detection transistor, thereby constituting a second inverter. The second detector 57 differs in this point from the second detector 43 in the first embodiment.

In this embodiment, when the first phase difference signal $\phi$R goes low, the pMOS transistor 47 is turned on substantially at the same time as the pMOS transistor 18 is turned on. As a result, the output signal of the first detector 56 goes high so that the turn-ON action of the pMOS transistor 18 can be detected. When the second phase difference signal $\phi$P goes high, the nMOS transistor 52 is turned on substantially at the same time as the nMOS transistor 19 is turned on. As a result, the output signal of the second detector 57 goes high so that the turn-ON action of the nMOS transistor 19 can be detected. The reset circuit 55 in the second embodiment therefore has substantially the same advantages as the reset circuit 17 in the first embodiment.

A third embodiment of the present invention will be now discussed with reference to FIG. 7. To avoid the redundant description, like or same reference numerals are given to those components which are the same as the corresponding components of the first embodiment in FIG. 2.

Figure 7:
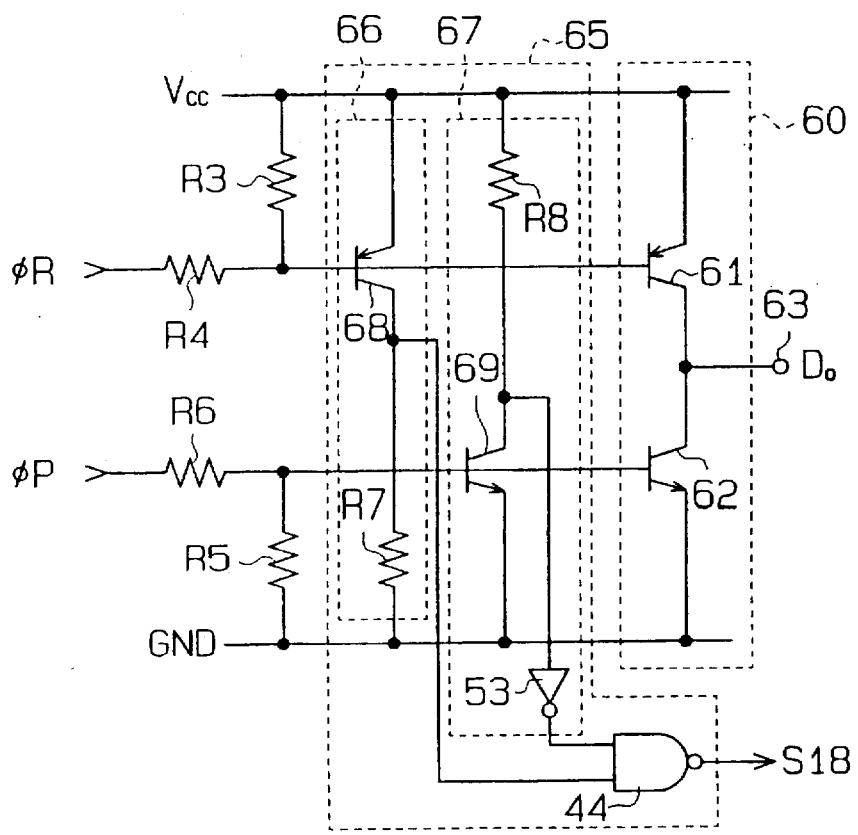
FIG. 7 is a circuit diagram illustrating a reset circuit and a charge pump circuit according to a third embodiment of the present invention.

In the third embodiment in FIG. 7, another reset circuit 65 and another charge pump circuit 60 are used in the PLL frequency synthesizer 10. The charge pump circuit 60 comprises a pnp transistor 61 as a first transistor and an npn transistor 62 as a second transistor, both connected in series between the power supply $V_{CC}$ and the ground GND. The collectors of the pnp transistor 61 and npn transistor 62 are connected to an output terminal 63, which is connected to the aforementioned LPF 15 in FIG. 1.

The base of a pnp transistor 61 is connected via a resistor R3 to the power supply $V_{CC}$ and is supplied with the first phase difference signal φR via a resistor R4. The base of an npn transistor 62 is connected via a resistor R5 to the ground GND and is supplied with the second phase difference signal φP via a resistor R6.

Based on the voltage potentials of the first and second phase difference signals φR and φP, the pnp transistor 61 and the npn transistor 62 are turned either on or off. In accordance with the ON/OFF actions of the transistors 61 and 62, the charge pump circuit 60 outputs the voltage signal Do from the output terminal 63.

The reset circuit 65 has a first detector 66, a second detector 67 and the same 2-input NAND gate 44 as used in the above-described second embodiment. The first detector 66 uses a pnp transistor 68 as a first detection transistor instead of the pMOS transistor 47. A load resistor R7, instead of the nMOS transistor 48, is connected to the pnp transistor 68, thereby constituting a first inverter. Hence, the first detector 66 in the third embodiment differs in these points from the first detector 42 in the first embodiment.

The second detector 67 uses an npn transistor 69 as a second detection transistor instead of the nMOS transistor 52. A load resistor R8, instead of the pMOS transistor 51, is connected to the npn transistor 69, thereby constituting a second inverter. Hence, the second detector 67 in the third embodiment differs in these points from the second detector 43 in the first embodiment.

The size of the pnp transistor 68 is equal to that of the pnp transistor 61 in the charge pump circuit 60, and the size of the npn transistor 69 is equal to that of the npn transistor 62 in the charge pump circuit 60. When the first phase difference signal φR goes low, the pnp transistor 68 is turned on substantially at the same time as the pnp transistor 61 is turned on. It is therefore possible to detect the turn-ON action of the pnp transistor 61 based on the ON action of the pnp transistor 68.

When the second phase difference signal φP goes high, the npn transistor 69 is turned on substantially at the same time as the npn transistor 62 is turned on. It is therefore possible to detect the turn-ON action of the npn transistor 62 based on the ON action of the npn transistor 69.

The reset circuit 65 in this embodiment therefore has substantially the same advantages as the reset circuit 17 in the first embodiment. Since the charge pump circuit 60 is constituted of bipolar transistors which operate faster than MOS transistors, the frequency signal can be more quickly locked to the set frequency.

A fourth embodiment will be now discussed with reference to FIGS. 9 to 13. To avoid the redundant description, like or same reference numerals are given to those components which are the same as the corresponding components of the first embodiment in FIG. 2. The differences between the aforementioned phase comparator 13 and reset circuit 17 and those corresponding circuits of this embodiment will be mainly described below.

Figure 9:
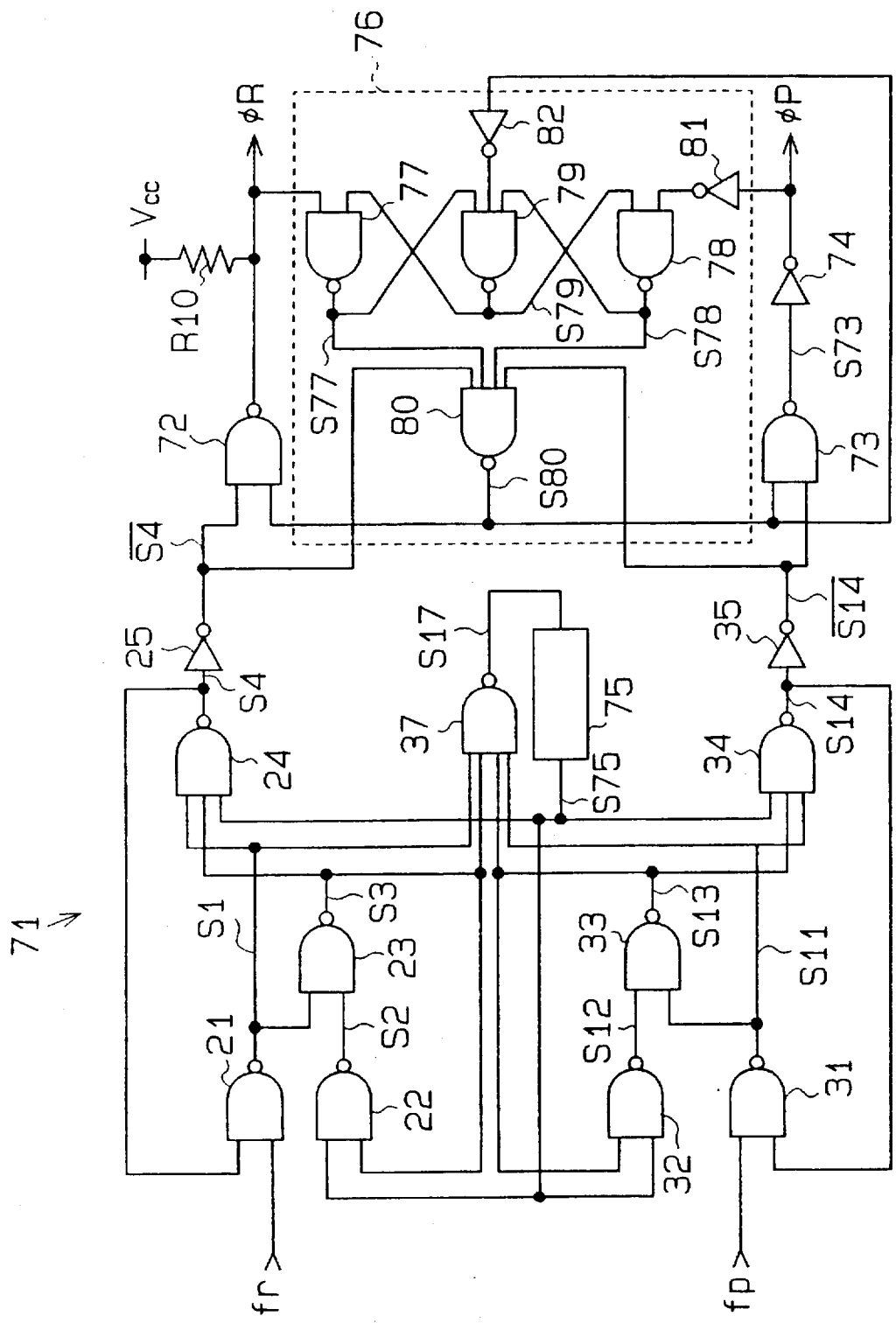
FIG. 9 is a circuit diagram of a reset circuit according to a fourth embodiment of the present invention.

In the fourth embodiment in FIG. 9, a phase comparator 71 and a reset circuit 76 are used in the PLL frequency synthesizer 10 in FIG. 1. The phase comparator 71 comprises seven 2-input NAND gates 21 to 23, 31 to 33 and 40, two 3-input NAND gates 24 and 34, a single 4-input NAND gate 37, three inverters 25, 35 and 74, a delay circuit 75 and a pull-up resistor R10.

The NAND gate 24 receives the output signal, S75, of the delay circuit 75 as well as the signals S1 and S3, and outputs the signal S4 based on these three signals S1, S3 and S75. The NAND gate 22 receives the two signals S3 and S75, based on which it outputs the signal S2. The NAND gate 34 receives the three signals S1, S13 and S75, based on which it outputs the signal S14. The NAND gate 32 receives the two signals S13 and S75, based on which it outputs the signal S12.

The NAND gate 37 receives the four signals S1, S3, S11 and S13, based on which it outputs the signal S17 to the delay circuit 75. The delay circuit 75, like the aforementioned delay circuit 238, comprises an even number of inverters connected in series. Based on the signal S17, the delay circuit 75 outputs the signal S75 which is in phase with the signal S17 and which is acquired by delaying the signal S17.

A NAND gate 72 receives a signal /S4 from the inverter 25, /S4 being the inverse of S4 which is input to the inverter 25, and also a reset signal S80 from the reset circuit 76. The output terminal of the NAND gate 72 is connected via the pull-up resistor R10 to the power supply $V_{CC}$. The NAND gate 72 outputs the first phase difference signal φR based on both signals /S4 and S80.

Figure 10:
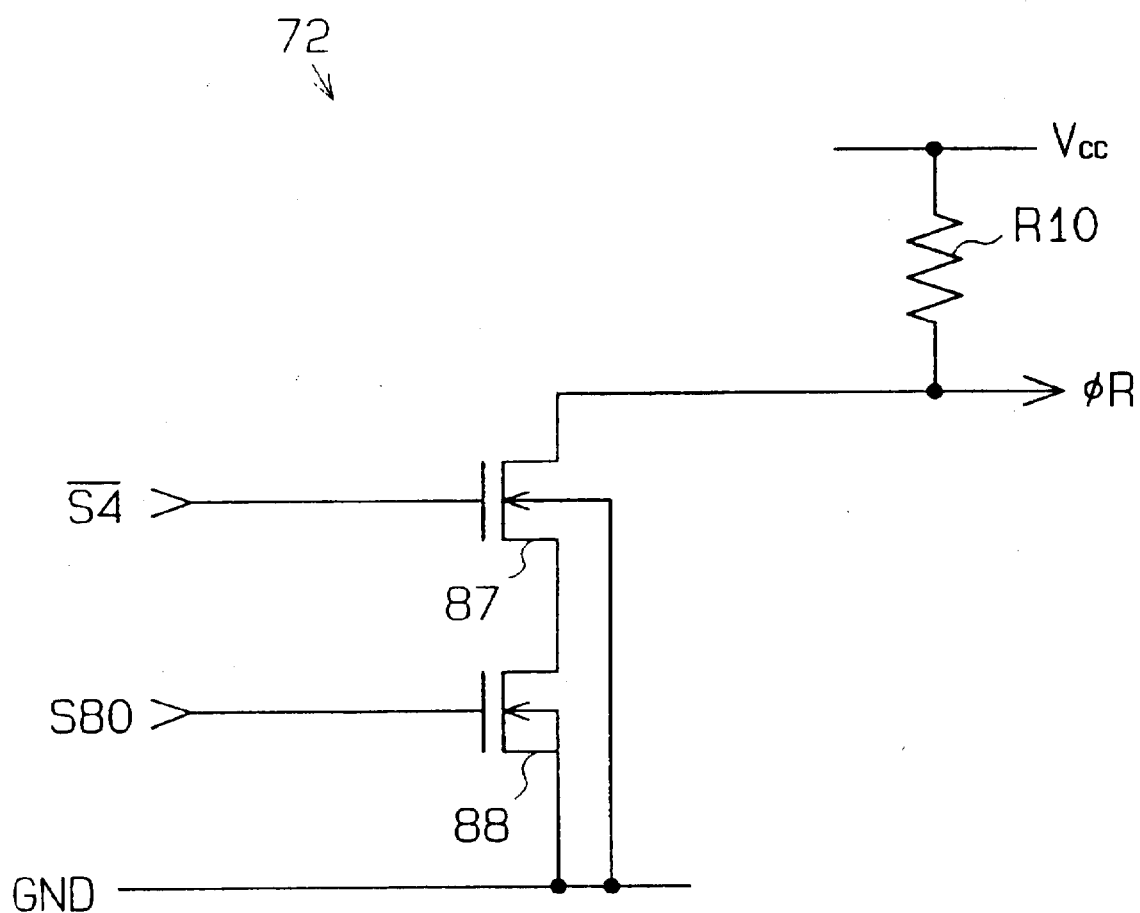
FIG. 10 is a circuit diagram of a 2-input NAND gate.

As shown in FIG. 10, the NAND gate 72 has two nMOS transistors 87 and 88 connected in series to the ground GND in this embodiment. The drain of the nMOS transistor 87 is connected via the pull-up resistor R10 to the power supply $V_{CC}$, so that the NAND gate 72 is of an open-drain type.

The bodies of both nMOS transistors 87 and 88 are connected to the ground GND. The signal /S4 is supplied to the gate of the nMOS transistor 87, and the reset signal S80 is supplied to the gate of the nMOS transistor 88. When the reset signal S80 is at a low level, the nMOS transistor 88 is turned off, so that the first phase difference signal φR is output at a high level regardless of the level of the signal S4. When the reset signal S80 is at a high level, the nMOS transistor 88 is turned on. The nMOS transistor 87 is turned on or off based on the level of the signal /S4. When the nMOS transistor 87 is enabled, therefore, the first phase difference signal φR is generated having the same level as that of the signal S4.

A NAND gate 73 in FIG. 9 receives a signal /S14 from the inverter 35, /S14 being the inverse of S14 which is input to the inverter 35, and also the reset signal S80, and outputs a signal S73 based on those two signals. When the reset signal S80 has a low level, therefore, the signal S73 is output at a high level regardless of the level of the signal S14. When the reset signal S80 has a high level, the signal S73 is output having the same level as that of the signal S14.

The inverter 74 is connected to the output terminal of the NAND gate 73, and inverts the signal S73 to yield the second phase difference signal φP. The reset circuit 76 detects the conductive states of the pMOS transistor 18 and nMOS transistor 19 in the charge pump circuit 14 in FIG. 2. When detecting that both transistors 18 and 19 are turned on, the reset circuit 76 inhibits the first phase difference signal φR from generating a low level signal and the second phase difference signal φP from generating a high level signal.

The reset circuit 76 comprises a 2-input NAND gate 77 as a first detector, a 2-input NAND gate 78 as a second detector, a 4-input NAND gate 80 as a signal generator, a 3-input NAND gate 79 and two inverters 81 and 82.

The NAND gate 77 receives the first phase difference signal φR and also the output signal S79 of the NAND gate 79, and outputs a signal S77 based on both input signals. When the signal S79 has a low level, the signal S77 is output at a high level irrespective of the level of the first phase difference signal φR. When the signal S79 has a high level, the signal S77 is output having a level that is the inverse of the first phase difference signal φR. When the first phase difference signal φR goes low, therefore, the signal S77 goes high. At this time, since the pMOS transistor 18 in the charge pump circuit 14 is turned on based on the first phase difference signal φR being low, it is possible to detect the ON action of the pMOS transistor 18 by the high level of the signal S77.

The NAND gate 78 receives the output signal S79 as well as the signal /φP received from the inverter 81. When the signal S79 is at a low level, the signal S78 is output at a high level irrespective of the level of the signal S73. When the signal S79 is at a high level, the signal S78, whose level is inverted relative to the signal S73, is output by NAND gate 78. When the second phase difference signal φP goes high, therefore, the signal S78 goes high. Once S78 goes high, since the nMOS transistor 19 in the charge pump circuit 14 is turned on based on the second phase difference signal φP being high, it is possible to detect the ON action of the nMOS transistor 19 by the high level of the signal S78.

Based on the four signals /S4, S77, S78 and /S14, the NAND gate 80 sends out the reset signals S80 to the NAND gates 72 and 73 to inhibit the outputting of the first phase difference signal φR at a low level and the second phase difference signal φP at a high level. With the signals /S4 and /S14 at high levels, when it is detected that the output signals of the NAND gates 77 and 78 both go high, i.e., when it is detected that the pMOS transistor 18 and nMOS transistor 19 in the charge pump circuit 14 have both been turned on, the NAND gate 80 sends out the reset signal S80 at a low level.

The NAND gate 79 receives the signals S77, S78 and a signal, whose level is the inverse of the reset signal S80, and outputs the signal S79 based on those input signals. When the signals S77 and S78 both go high and the signal S80 goes low, the signal S79 goes low. When either the signal S77 or the signal S78 is low, or when the signal S80 is high, the signal S79 goes high.

Figure 11:
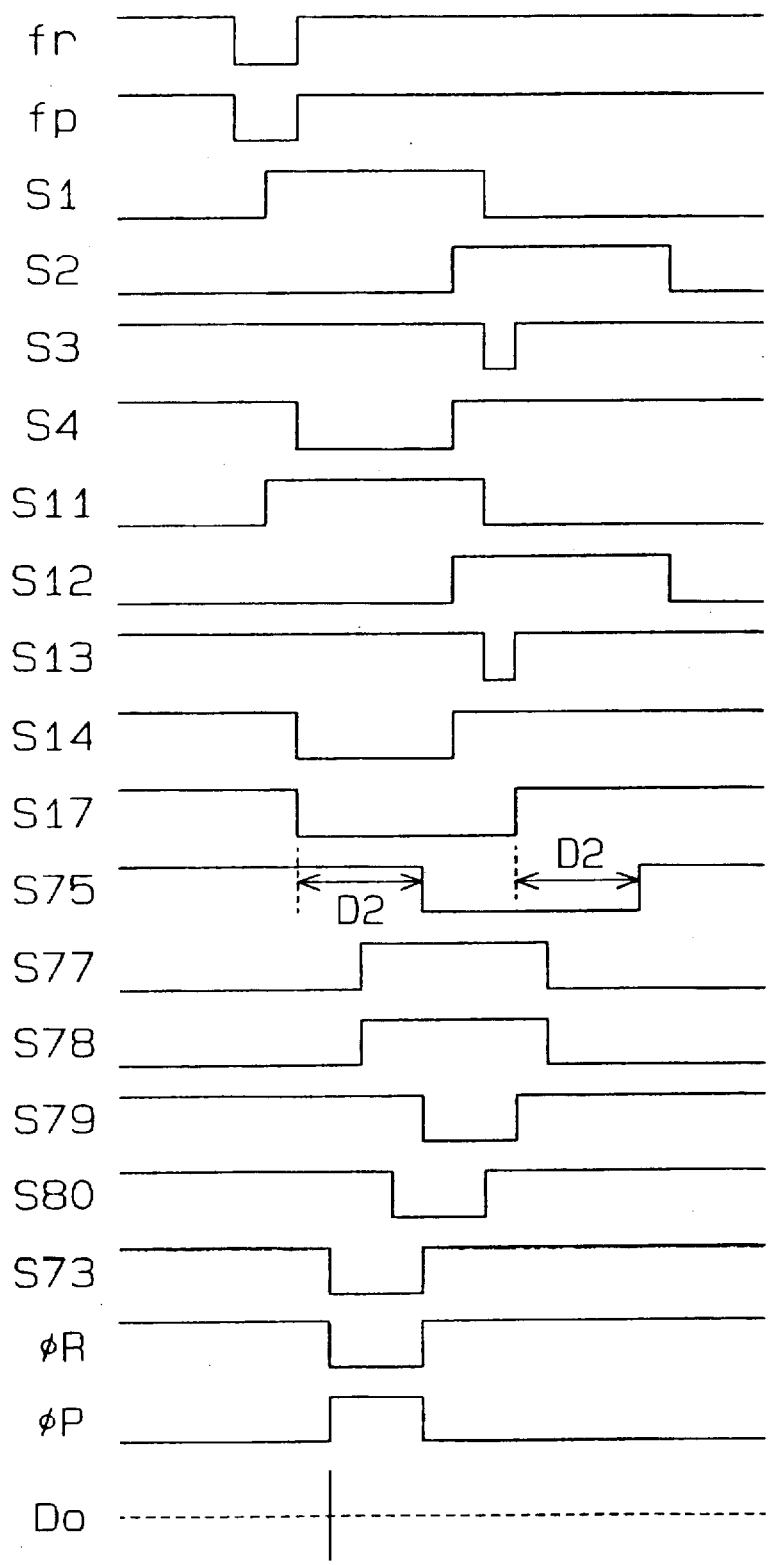
FIG. 11 is a timing diagram for a phase comparator in FIG. 9.

The functions of the thus constituted phase comparator 71 and reset circuit 76 will be now explained with reference to FIGS. 11 through 13. FIG. 11 illustrates the operation of the synthesizer 10 when the phase of the reference signal fr matches with the phase of the comparison signal fp. When the reference signal fr goes low, the signal S1 goes high, based on which the signal S4 goes low. The signal S4 being low causes the first phase difference signal φR to go low.

When the comparison signal fp goes low, the signal S11 goes high, based on which the signal S14 goes low. As a result, the signal S73 goes low and the second phase difference signal φP goes high. Therefore, the pMOS transistor 18 of the charge pump circuit 14 is turned on based on the first phase difference signal φR being low, and the nMOS transistor 19 is turned on based on the second phase difference signal φP being high.

As the first phase difference signal φR goes low, the signal S77 goes high, and as the signal S73 goes low, the signal S78 goes high. As a result, the reset signal S80 goes low, based on which the first phase difference signal φR goes high, the signal S73 goes high, and the second phase difference signal φP goes low. The pMOS transistor 18 in the charge pump circuit 14 is turned off based on the first phase difference signal φR being high, and the nMOS transistor 19 is turned off based on the second phase difference signal φP being low.

The two phase difference signals φP and φR are enabled or disabled at the same timing. Therefore, the operation times of the two transistors 18 and 19 overlap each other and the output voltage Do does not change.

When the reset signal S80 goes low, the signals S77 and S78 both have low levels, so that the signal S79 goes low. When the signals S1 and S11 goes high, the signal S17 goes low. Consequently, the signal S75 goes low after a delay of the delay time D2 of the delay circuit 75. As the signal S75 goes low, the signals S4 and S14 both go high and the signals S2 and S12 both go high.

When the signals S4 and S14 both go high, the reset signal S80 goes high, causing the signal S79 to go high. At this time, the first and second phase difference signals φR and φP respectively have high and low levels, so that signals S77 and S78 both go low.

When the signal S2 goes high, the signal S3 goes low, and when the signals S12 goes high, the signal S13 goes low. As the signal S4 goes high, the signal S1 goes low, and as the signal S14 goes high, the signal S11 goes low. The low level signal S1 causes the signal S3 to go high, and the low level signal S11 causes the signal S13 to go high. As the signals S1 and S11 go low, the signal S17 goes high. The signal S75 goes high after a delay of the delay time D2 of the delay circuit 75 after the signal S17 goes high. As the signal S75 goes high, the signals S2 and S12 both go low.

Figure 12:
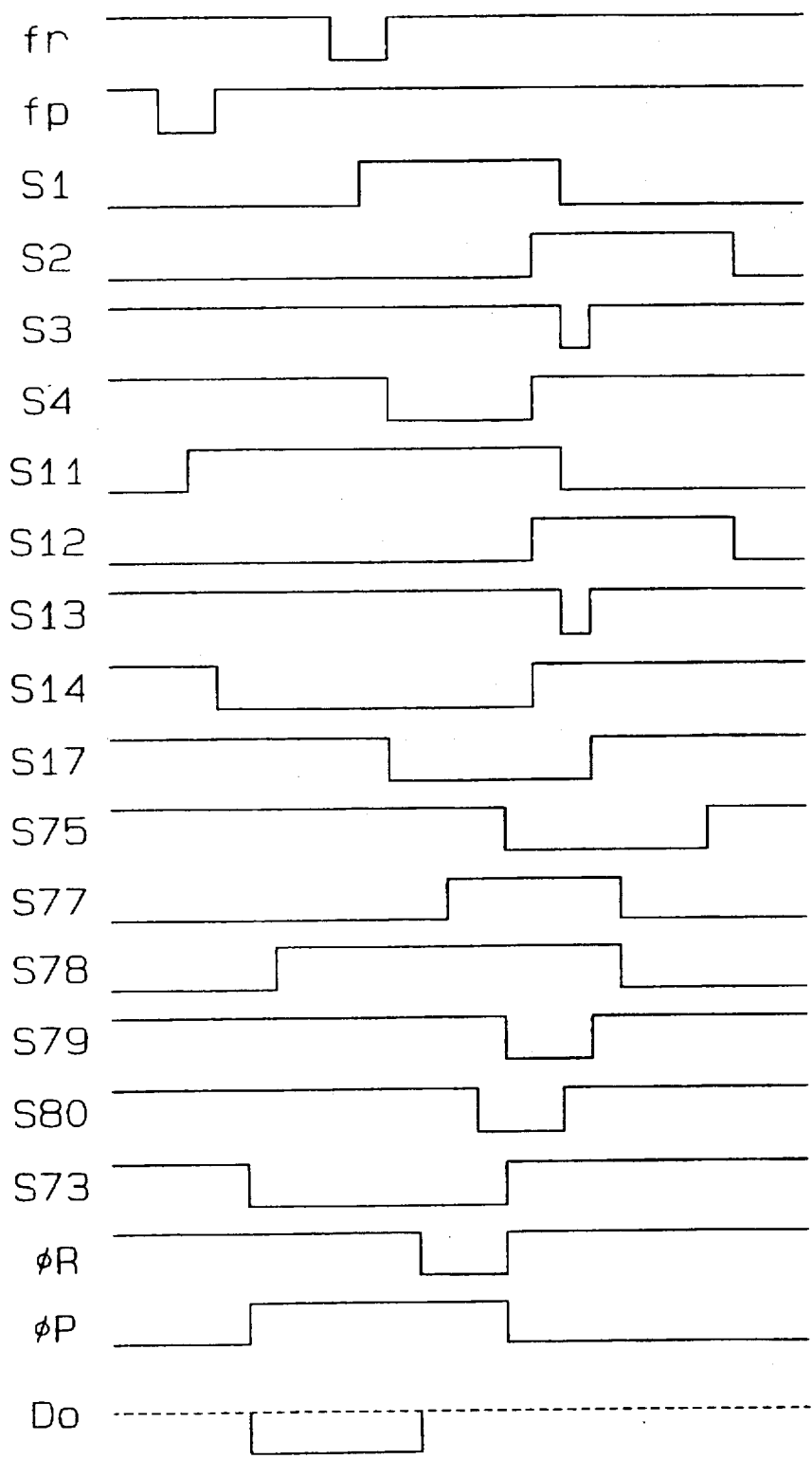
FIG. 12 is a timing diagram for the phase comparator in FIG. 9.

FIG. 12 illustrates the operation of the synthesizer 10 in the case where the phase of the comparison signal fp leads the phase of the reference signal fr. When the comparison signal fp goes low, the signal S11 goes high, based on which the signal S14 goes low. The signal S14 being low causes the signal S73 to go low and the second phase difference signal φP to go high.

The nMOS transistor 19 in the charge pump circuit 14 is turned on based on the second phase difference signal φP being high. As the signal S73 goes low, the signal S78 goes high. When the reference signal fr goes low thereafter, the signal S1 goes high, based on which the signal S4 goes low. Consequently, the first phase difference signal φR goes low.

The pMOS transistor 18 in the charge pump circuit 14 is turned on based on the first phase difference signal φR being low. When the first phase difference signal φR goes low, the signal S77 goes high. When the signal S77 goes high, the signal S78 goes high, so that the reset signal S80 goes low. Based on the reset signal S80 being low, the first phase difference signal φR goes high, signal S73 goes high and the second phase difference signal φP goes low. The pMOS transistor 18 is turned off based on the first phase difference signal φR being high, and the nMOS transistor 19 is turned off based on the second phase difference signal φP being low. The two phase difference signals φR and φP are disabled with the phase difference between the reference signal fr and the comparison signal fp maintained, and the output voltage Do is controlled in accordance with that phase difference. In this case, since the phase of the comparison signal fp leads the phase of the reference signal fr, the voltage of the control voltage signal $V_T$ is dropped to reduce the frequency of the frequency signal fv.

When the reset signal S80 goes low, the signals S77 and S78 both go high, so that the signal S79 goes low. When the signals S1 and S11 go high, the signal S17 goes low. Consequently, the signal S75 goes low after a delay of the delay time D2 of the delay circuit 75. As the signal S75 goes low, the signals S4 and S14 both go high and the signals S2 and S12 both go high.

When the signals S4 and S14 both go high, the reset signal S80 goes high, causing the signal S79 to go high. At this time, the first and second phase difference signals φR and φP respectively have high and low levels, so that signals S77 and S78 both go low.

When the signal S2 goes high, the signal S3 goes low, and when the signal S12 goes high, the signal S13 goes low. As the signal S4 goes high, the signal S1 goes low, and as the signal S14 goes high, the signal S11 goes low. The signal S1 being low causes the signal S3 to go high, and the signal S11 being low causes the signal S13 to go high. As the signals S1 and S11 go low, the signal S17 goes high.

The signal S75 goes high after a delay of the delay time D2 of the delay circuit 75 after the signal S17 goes high. As the signal S75 goes high, the signals S2 and S12 both go low.

Figure 13:
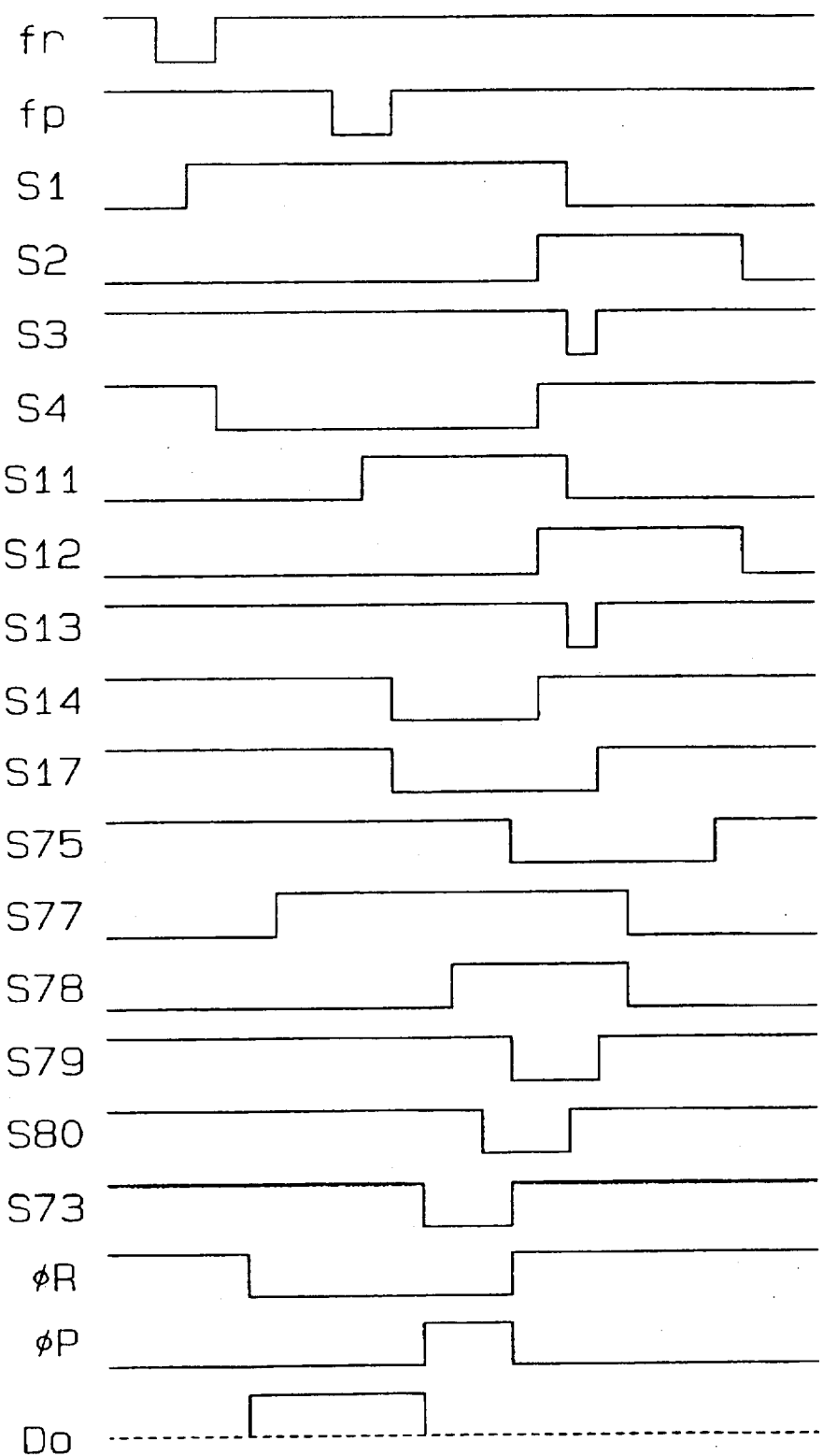
FIG. 13 is a timing diagram for the phase comparator in FIG. 9.

FIG. 13 illustrates the operation of the synthesizer 10 in the case where the phase of the comparison signal fp lags the reference signal fr. When the reference signal fr goes low, the signal S1 goes high, based on which the signal S4 goes low. The signal S4 being low causes the first phase difference signal φR to go low.

The pMOS transistor 18 is turned on based on the first phase difference signal φR being low. As the first phase difference signal φR goes low, the signal S77 goes high. When the comparison signal fp goes low thereafter, the signal S11 goes high, based on which the signal S14 goes low. Consequently, the signal S73 goes low and the second phase difference signal φP goes high.

The nMOS transistor 19 is turned on based on the second phase difference signal φP being high. As the signal S73 goes low, the signal S78 goes high. When the signal S78 goes high, the signal S77 goes high, so that the reset signal S80 goes low. Based on the reset signal S80 being low, the first phase difference signal φR goes high, the signal S73 goes high and the second phase difference signal φP goes low. The pMOS transistor 18 is turned off based on the first phase difference signal φR being high, and the nMOS transistor 19 is turned off based on the second phase difference signal φP being low. The two phase difference signals φR and φP are disabled with the phase difference between the reference signal fr and the comparison signal fp maintained, and the output voltage Do is controlled in accordance with that phase difference. In this case, since the phase of the comparison signal fp lags the phase of the reference signal fr, the voltage of the control voltage signal $V_T$ is increased to generate a corresponding increase in the frequency of the frequency signal fv.

When the reset signal S80 goes low, the signals S77 and S78 both go high, so that the signal S79 goes low. When the signals S1 and S11 go high, the signal S17 goes low. Consequently, the signal S75 goes low after a delay of the delay time D2 of the delay circuit 75. As the signal S75 goes low, the signals S4 and S14 both go high and the signals S2 and S12 both go high.

When the signals S4 and S14 both go high, the reset signal S80 goes high, causing the signal S79 to go high. At this time, the first and second phase difference signals φR and φP respectively have low and high levels, so that signals S77 and S78 both go low.

When the signal S2 goes high, the signal S3 goes low, and when the signal S12 goes high, the signal S13 goes low. As the signal S4 goes high, the signal S1 goes low, and as the signal S14 goes high, the signal S11 goes low. The signal S1 being low causes the signal S3 to go high, and the signal S11 being low causes the signal S13 to go high. As the signals S1 and S11 go low, the signal S17 goes high. As a result, the signal S75 goes high after a delay of the delay time D2 of the delay circuit 75. The signal S75 being high causes the signals S2 and S12 both to go low.

As will be appreciated, the embodiment of FIG. 9 has a number of advantageous features, some of which are now described.

(1) When it is detected by the NAND gates 77 and 78 that the pMOS transistor 18 and nMOS transistor 19 of the charge pump circuit 14 are both turned on, the reset circuit 76 in this embodiment outputs the reset signal S80 at a low level. Consequently, the reset circuit 76 resets the first phase difference signal φR to a high level and the second phase difference signal φP to a low level.

Accordingly, the delay time for the first and second phase difference signals φR and φP to be reset becomes the sum of the delay times of the NAND gates 77 and 78 and the delay time of the NAND gate 80. Therefore, the delay time can be made shorter than the one provided by the reset circuit 17 in the first embodiment.

(2) The gate for resetting the first and second phase difference signals φR and φP is made of fewer elements, namely, the NAND gates 77 and 78 at the first stage and the NAND gate 80 at the second stage. Therefore, a variation in the precision of manufactured products, if present, hardly causes a variation in the delay time for the first and second phase difference signals φR and φP to be reset, so that the delay time can be set with greater consistency.

(3) The NAND gates 77 and 78 are used as the first and second detectors. The NAND gates 77 and 78 have only to output a signal to control the NAND gate 80. Therefore, both NAND gates 77 and 78 can be constituted of MOS transistors of a small size. This contributes to the reduction of the chip-occupying area of the reset circuit 76 and thus ensures higher integration.

(4) The NAND gate 72 in this embodiment is of an open-drain type which comprises two nMOS transistors 87 and 88. It is thus possible to reduce the number of elements as compared with the ordinary NAND gate which needs four MOS transistors, thus ensuring higher integration.

A fifth embodiment will be now discussed with reference to FIG. 14. To avoid the redundant description, like or same reference numerals are given to those components which are the same as the corresponding components of the embodiment in FIG. 9. The differences between the aforementioned phase comparator 71 and that of this embodiment will be mainly described below.

Figure 14:
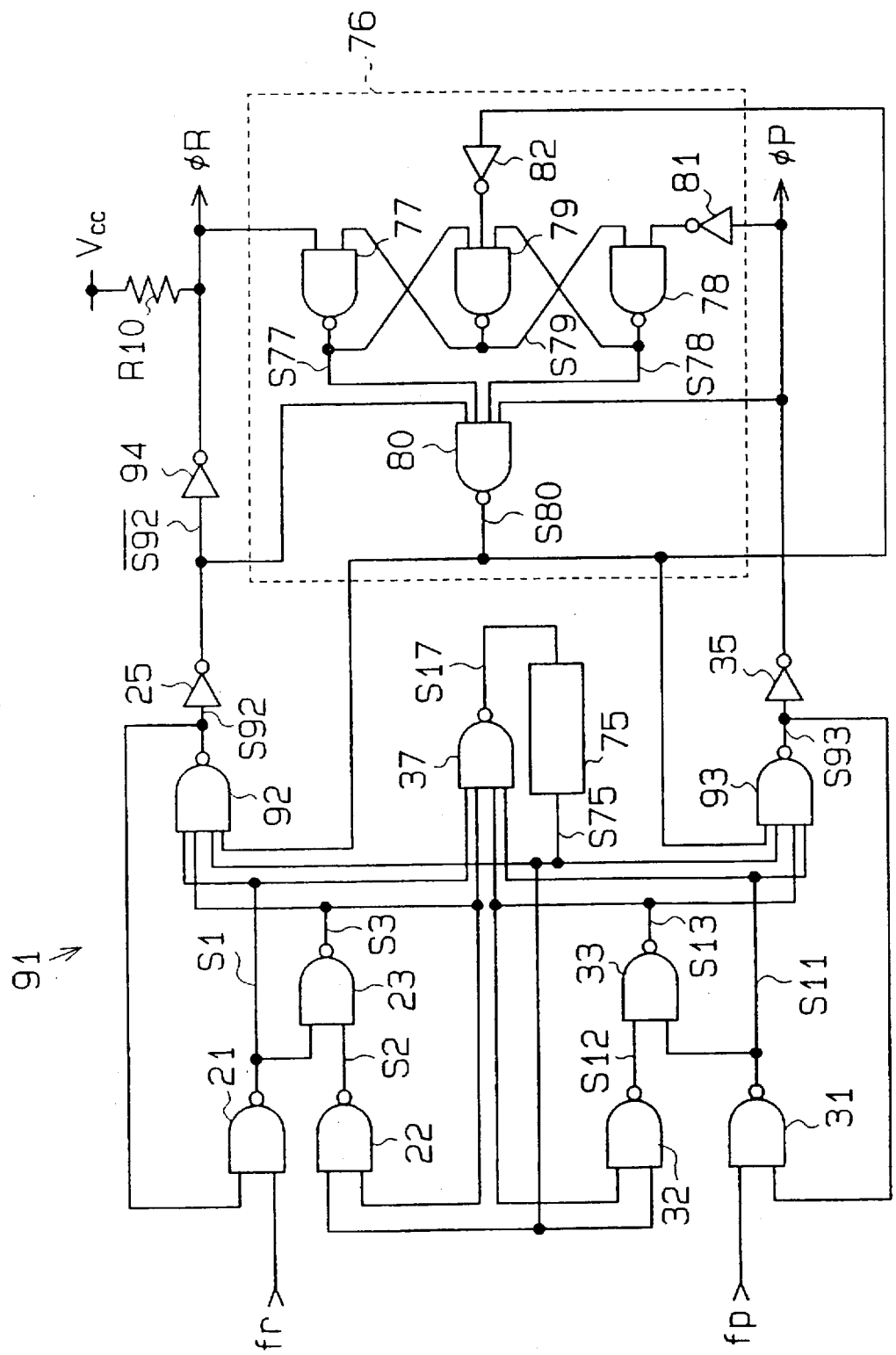
FIG. 14 is a circuit diagram of a reset circuit according to a fifth embodiment.

FIG. 14 illustrates another phase comparator 91 and the reset circuit 76 used in the PLL frequency synthesizer 10. The phase comparator 91 uses 4-input NAND gates 92 and 93 instead of the 3-input NAND gates 24 and 34, and an inverter 94 in place of the 2-input NAND gate 72. Further, the 2-input NAND gate 73 and the inverter 74 are omitted. The other structure is the same as that of the phase comparator 71.

The NAND gate 92 receives the reset signal S80 from the NAND gate 80 as well as the signals S1, S3 and S75, and outputs a signal S92 based on the four signals S1, S3, S75 and S80.

The inverters 25 and 94 are connected in series to the output terminal of the NAND gate 92. The inverter 94 outputs the first phase difference signal φR of the same logic level as the signal S92. In this embodiment, the inverter 94 is comprised by an nMOS transistor of an open-drain type whose drain is connected via the pull-up resistor R10 to the power supply $V_{CC}$.

The NAND gate 93 receives the reset signal S80 as well as the signals S11, S13 and S75, and outputs a signal S93 based on the four signals S11, S13, S75 and S80. The inverter 35 inverts the output signal S93 of the NAND gate 93 to yield the second phase difference signal φP.

When the reset signal S80 goes low, the signal S92 goes high regardless of the levels of the signals S1, S3 and S75. Consequently, the first phase difference signal φR goes high, turning off the pMOS transistor 18 of the charge pump circuit 14.

Likewise, when the reset signal S80 goes low, the signal S93 goes high regardless of the levels of the signals S11, S13 and S75. Consequently, the second phase difference signal φP goes low, turning off the nMOS transistor 19 of the charge pump circuit 14.

The embodiment of FIG. 14 therefore has substantially the same functions and advantages as the embodiment of FIG. 9. Furthermore, as the aforementioned NAND gates 72 and 73 can be omitted, the circuit of the phase comparator 91 can be simplified as compared with the phase comparator 71, thus providing the benefits of fewer components.

Figure 15:
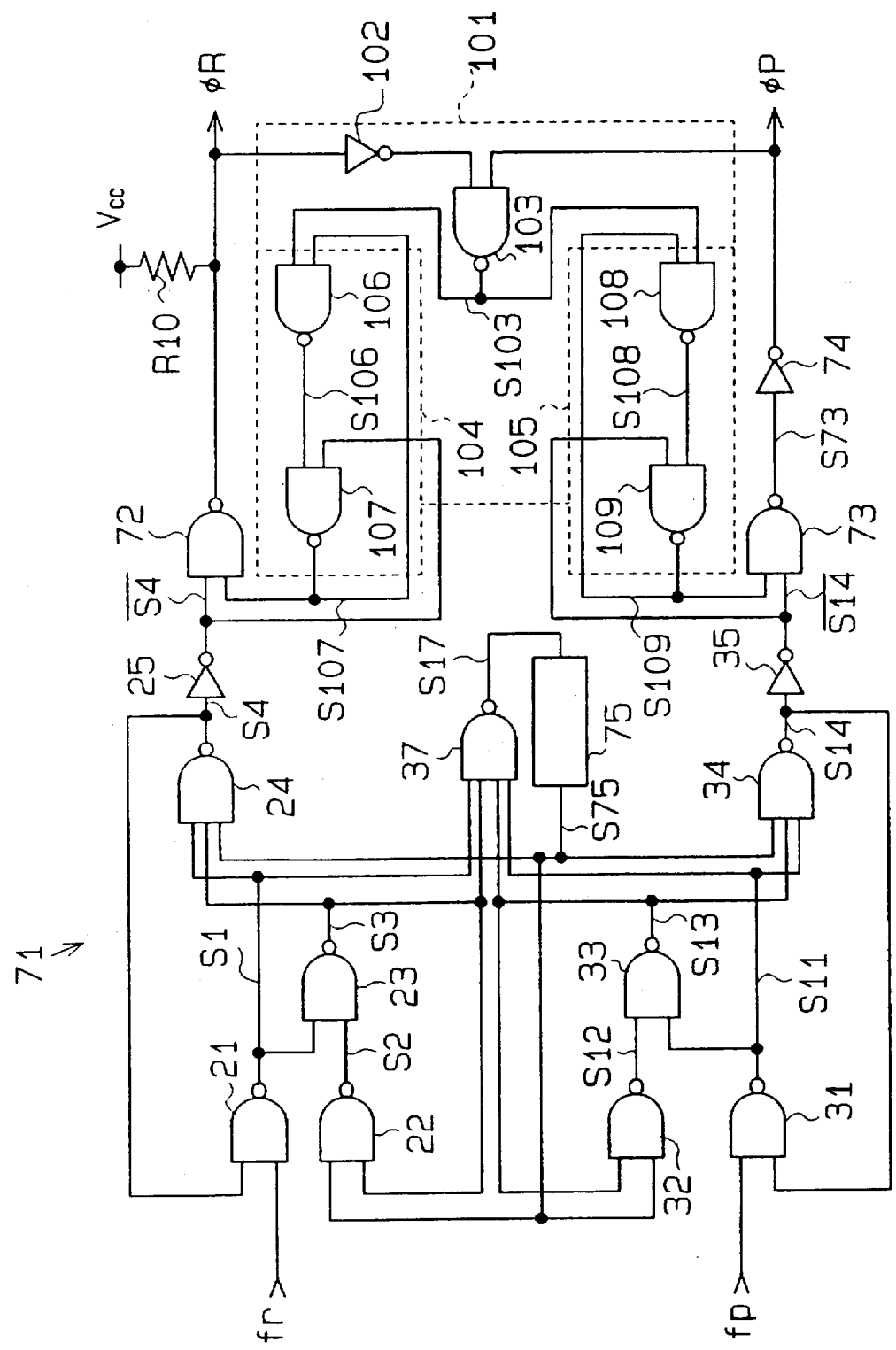
FIG. 15 is a circuit diagram of a reset circuit according to a sixth embodiment.

FIG. 15 illustrates a sixth embodiment of the present invention. Like or same reference numerals are given to those components which are the same as the corresponding components of the embodiment in FIG. 9. The differences between the aforementioned reset circuit 76 and that of this embodiment will be mainly described below with reference to FIG. 15.

In the sixth embodiment illustrated in FIG. 15, the NAND gate 72 in the phase comparator 71 receives a first reset signal S107 of a reset circuit 101 as well as the signal /S4 received from the inverter 25, with /S4 being the inverse of the signal S4. Based on both signals /S4 and S107, the NAND gate 72 outputs the first phase difference signal φR. When the first reset signal S107 is at a low level, the first phase difference signal φR is output at a high level regardless of the level of the signal S4. When the first reset signal S107 is at a high level, on the other hand, the first phase difference signal φR is output having the same level as that of the signal S4.

The NAND gate 73 receives a second reset signal S109 as well as the signal /S14 received from the inverter 35, with /S14 being the inverse of the signal S14. The NAND gate 73 outputs the signal S73 based on both signals /S14 and S109. When the second reset signal S109 is at a low level, the signal S73 is output at a high level regardless of the level of the signal S14. When the second reset signal S109 is at a high level, on the other hand, the signal S73 is output having the same level as that of the signal S14.

The reset circuit 101 has an inverter 102, a 2-input NAND gate 103 as a detector, and first and second signal generators 104 and 105. The NAND gate 103 receives the second phase difference signal φP as well as a signal received from the inverter 102, namely, the inverse of the first phase difference signal φR. The NAND gate 103 outputs a signal S103 based on both input signals. When the first phase difference signal φR goes low and the second phase difference signal φP goes high, the signal S103 goes low thereby indicating that the pMOS transistor 18 and nMOS transistor 19 of the charge pump circuit 14 are both turned on.

The first signal generator 104 has two 2-input NAND gates 106 and 107. The NAND gate 106 receives the signal S103 and a signal S107 output from the NAND gate 107, and outputs a signal S106 based on both signals S103 and S107.

The NAND gate 107 receives the signal /S4 and the output signal S106 of the NAND gate 106, based on which the NAND gate 107 outputs the first reset signal S107 to stop the first phase difference signal φR from outputting a low level signal. When the first and second phase difference signals φR and φP respectively become low and high levels, causing the signal S103 to go low, the signal S106 goes high.

As the signal /S4 has a high level at this time, the NAND gate 107 outputs the first reset signal S107 at a low level.

The second signal generator 105 has two 2-input NAND gates 108 and 109. The NAND gate 108 receives the signal S103 and a signal S109 output from the NAND gate 109, and outputs a signal S108 based on both signals S103 and S109.

The NAND gate 109 receives the signal /S14 and the output signal S108 of the NAND gate 108, based on which the NAND gate 109 outputs the second reset signal S109 to stop the second phase difference signal φP from outputting a high level signal. When the first and second phase difference signals φR and φP respectively become low and high levels, causing the signal S103 to go low, the signal S108 goes high. As the signal /s14 has a high level at this time, the NAND gate 109 outputs the second reset signal S109 at a low level.

In the case where a 4-input NAND gate and a 3-input NAND gate cannot be used due to the restricted layout of elements on a chip, the reset circuit 101 in this embodiment can obtain the same logic as the reset circuit 17 in the first embodiment can.

Figure 16:
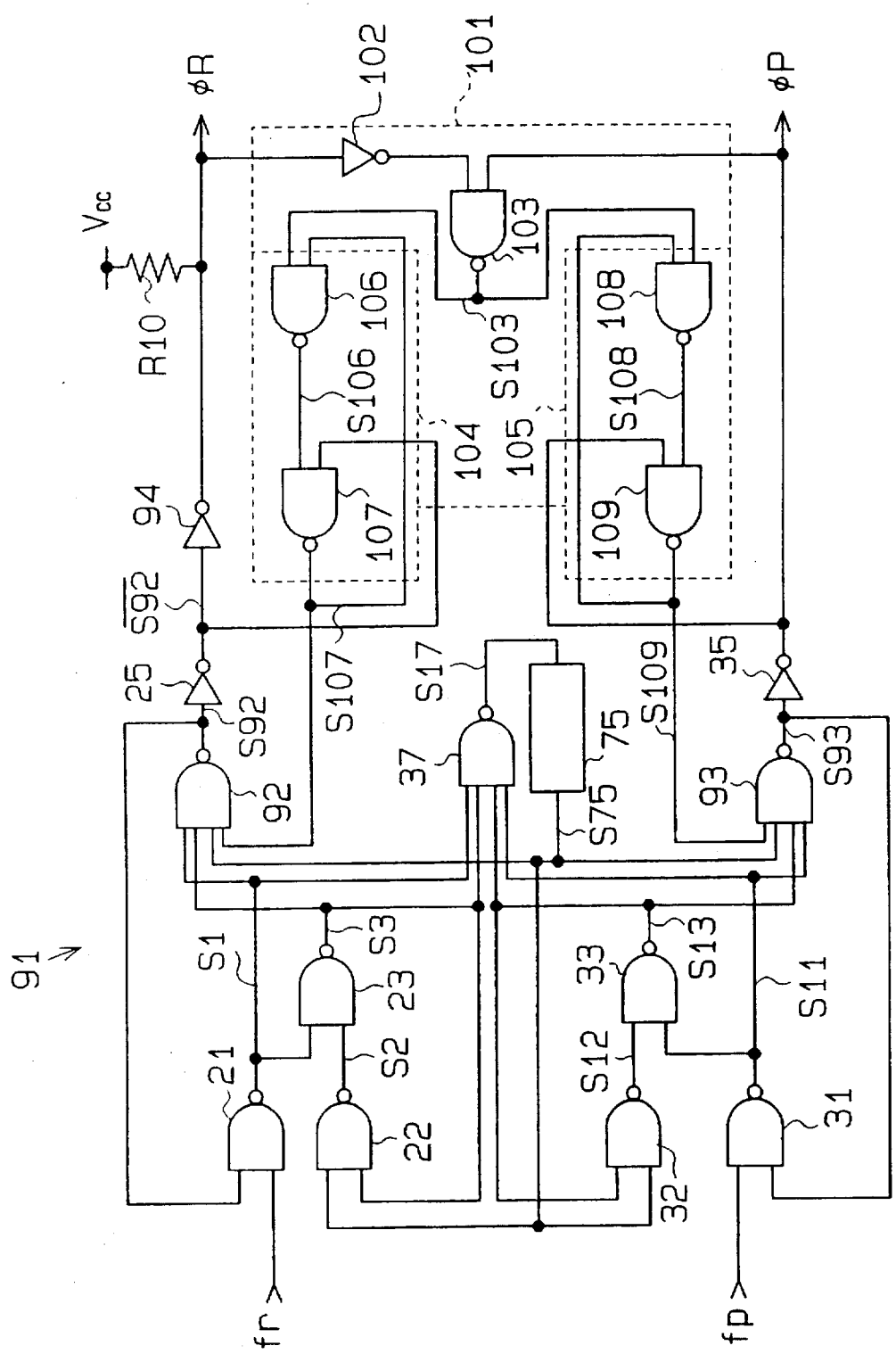
FIG. 16 is a circuit diagram of a reset circuit according to a seventh embodiment.
Figure 17:
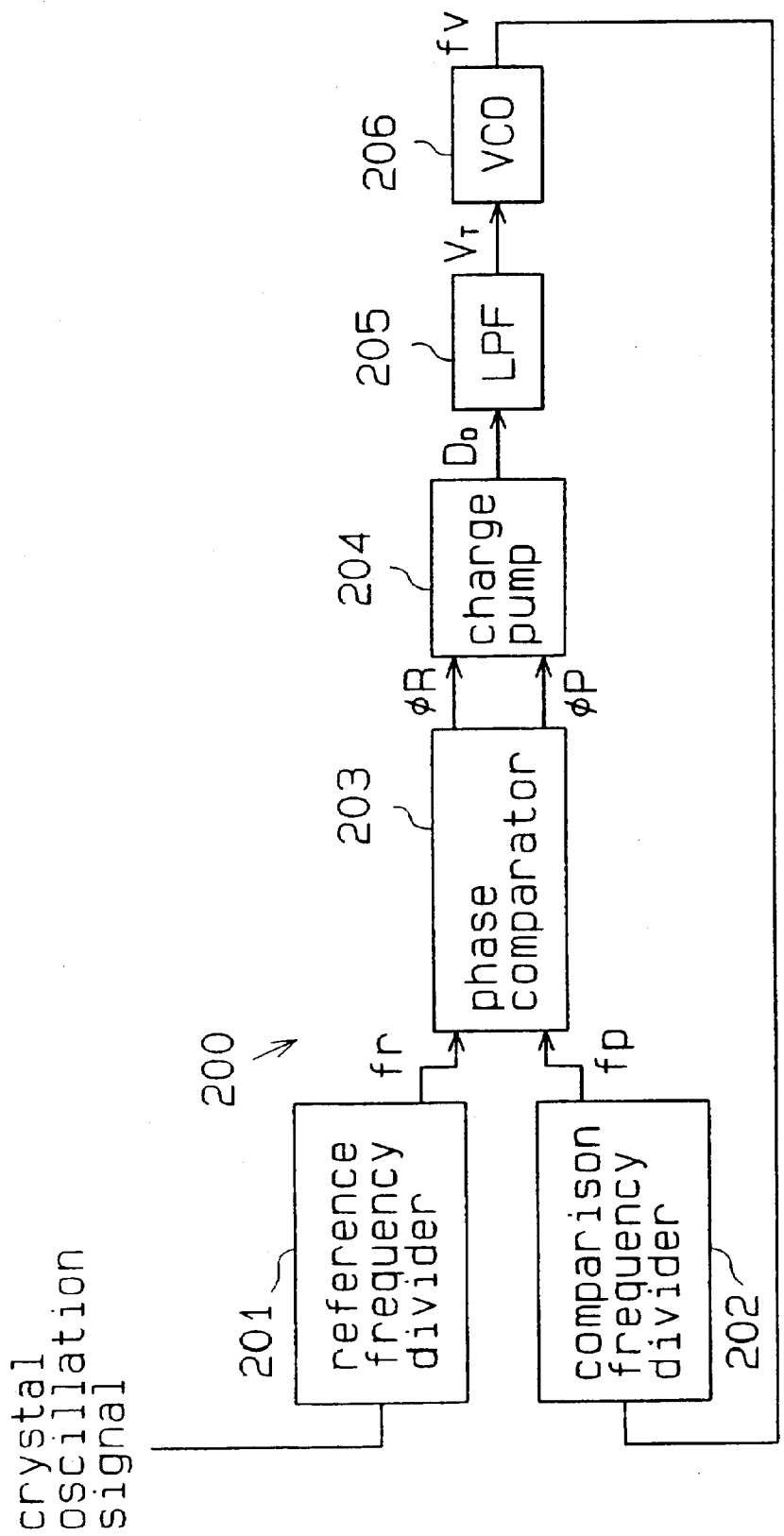
FIG. 17 is a block diagram showing a conventional PLL frequency synthesizer.

A seventh embodiment of this invention will be now discussed with reference to FIG. 16. Like or same reference numerals are given to those components which are the same as the corresponding components shown in FIGS. 14 and 15.

In this embodiment, the reset circuit 101 in the sixth embodiment is added to the phase comparator 91 in the fifth embodiment. The NAND gate 92 of the phase comparator 91 receives the signals S1, S3 and S75 and the first reset signal S107 of the reset circuit 101. This NAND gate 92 outputs the signal S92 based on the four signals S1, S3, S75 and S107.

The NAND gate 93 of the phase comparator 91 receives the signals S11, S13 and S75 and the second reset signal S109 of the reset circuit 101. The NAND gate 93 outputs the signal S93 based on the four signals S11, S13, S75 and S109.

In the reset circuit 101, the NAND gate 107 of the first signal generator 104 receives a signal /S92 and the signal S106, and outputs the first reset signal S107 based on both signals /S92 and S106.

When the first reset signal S107 goes low, the signal S92 goes high regardless of the levels of the signals S1, S3 and S75. Consequently, the first phase difference signal φR goes high turning off the pMOS transistor 18 of the charge pump circuit 14.

The NAND gate 109 of the second signal generator 105 receives the second phase difference signal φP and the signal S108, and outputs the second reset signal S109 based on both signals φP and S108.

When the second reset signal S109 goes low, the signal S93 goes high regardless of the levels of the signals S11, S13 and S75. As a result, the second phase difference signal φP goes low thereby turning off the nMOS transistor 19 of the charge pump circuit 14. This embodiment has the same functions and advantages as the fifth embodiment.

While this invention has been described in terms of several preferred embodiments, there are alterations, permutations, and equivalents which fall within the scope of this invention. It should also be noted that there are many alternative ways of implementing both the apparatus and method of the present invention. It is therefore intended that the following appended claims be interpreted as including all such alterations, permutations, and equivalents as fall within the true spirit and scope of the present invention.

What is claimed is:

1. A PLL frequency synthesizer for synchronizing an output frequency signal to a preset input frequency signal, said PLL frequency synthesizer comprising:

a voltage controlled oscillator for generating the output frequency signal in response to a voltage signal;

a comparison frequency divider for generating a comparison signal by dividing the output frequency signal from the voltage controlled oscillator;

a phase comparator for receiving a reference signal having a predetermined frequency and the comparison signal and, in response to the reference signal and the comparison signal, for generating a first phase difference signal and a second phase difference signal, each of the first and second phase difference signals being representative of a respective phase difference between the reference signal and the comparison signal;

a charge pump circuit for generating the voltage signal in response to the first and second phase difference signals, the charge pump having a first transistor being in an ON state in accordance with the first phase difference signal and a second transistor being in an ON state in accordance with the second phase difference signal; and a reset circuit for detecting the ON state of each of the first and second transistors of said charge pump circuit and for inhibiting the first and second phase difference signals generated by the phase comparator when the reset circuit detects that the first and second transistors of said charge pump circuit are both in the ON state, wherein said reset circuit includes:

a first detection circuit including a first detection transistor for detecting that the first charge pump transistor is in the ON state;

a second detection circuit including a second detection transistor for detecting that the second charge pump transistor is in the ON state; and a signal generating circuit connected to the first and second detection circuits for generating a reset signal to inhibit the first and second phase difference signals in response to the detection results of the first and second detection circuits.

2. A PLL frequency synthesizer according to claim 1, wherein said first processing circuit has a first CMOS circuit that includes the first detection transistor; and wherein said second processing circuit has a second CMOS circuit that includes the second detection transistor.

3. A PLL frequency synthesizer according to claim 1, wherein said first processing circuit includes a first inverter having the first detection transistor and a load resistor connected to the first detection transistor; and wherein said second processing circuit includes a second inverter having the second detection transistor and a load resistor connected to the second detection transistor.

4. A PLL frequency synthesizer according to claim 1, wherein the first detection transistor is a pMOS transistor and the second detection transistor is an nMOS transistor.

5. A PLL frequency synthesizer according to claim 2, wherein the first detection transistor is a pMOS transistor and the first CMOS circuit further includes a nMOS transistor, the pMOS transistor and the nMOS transistor being connected in series between a power supply $V_{CC}$ and a ground reference GND.

6. A PLL frequency synthesizer according to claim 3, wherein the first detection transistor is a pMOS transistor and the second detection transistor is an nMOS transistor, the first detection transistor and the load resistor are connected in series across a power supply and a ground reference, and the second detection transistor and the load resistor are also connected in series across the power supply and the ground reference.

7. A PLL frequency synthesizer comprising:

a voltage controlled oscillator (VCO) generating an output frequency signal in response to a voltage signal;

a comparison frequency divider receiving and frequency dividing the output frequency signal from the VCO to generate a comparison signal;

a phase comparator receiving a reference signal having a predetermined frequency and the comparison signal, comparing a phase of the reference signal with a phase of the comparison signal, and generating a first phase difference signal and a second phase difference signal, wherein the first phase difference signal corresponds to the phase difference between the reference signal and the comparison signal when the phase of the reference signal leads the phase of the comparison signal and the second phase difference signal corresponds to the phase difference between the reference signal and the comparison signal when the phase of the comparison signal leads the phase of the reference signal, and the phase comparator further receiving a reset signal for inhibiting the first and second phase difference signals;

a charge pump circuit, including first and second transistors connected in series between a power supply and ground, the first transistor receiving the first phase difference signal and the second transistor receiving the second phase difference signal, the charge pump generating the voltage signal at a node between the first and second transistors, wherein the first transistor is in an ON state in accordance with the first phase difference signal and the second transistor is in an ON state in accordance with the second phase difference signal; and a reset circuit detecting the ON state of each of the first and second charge pump transistors and inhibiting the first and second phase difference signals generated by the phase comparator when the first and second charge pump transistors are both in the ON state, wherein the reset circuit includes:

a first detector having a pMOS transistor and an nMOS transistor connected in series between a power supply and ground, wherein the first phase difference signal is input to the gates of the pMOS and nMOS transistors and a first detector output signal is generated at a node between the pMOS transistor and the nMOS transistor;

a second detector having a pMOS transistor and an nMOS transistor connected in series between the power supply and ground, wherein the second phase difference signal is input to the gates of the second detector pMOS and nMOS transistors and a second detector output signal is generated at a node between the second detector pMOS and nMOS transistors, and an inverter for receiving and inverting the second detector output signal; and a signal generator receiving the first detector output signal and the inverted second detector output signal and generating the reset signal therefrom.

8. A PLL frequency synthesizer comprising:

a voltage controlled oscillator (VCO) for generating an output frequency signal in response to a voltage signal;

a comparison frequency divider receiving and frequency dividing the output frequency signal from the VCO to generate a comparison signal;

a phase comparator receiving a reference signal having a predetermined frequency and the comparison signal, comparing a phase of the reference signal with a phase of the comparison signal, and generating a first phase difference signal and a second phase difference signal, wherein the first phase difference signal corresponds to the phase difference between the reference signal and the comparison signal when the phase of the reference signal leads the phase of the comparison signal and the second phase difference signal corresponds to the phase difference between the reference signal and the comparison signal when the phase of the comparison signal leads the phase of the reference signal, and the phase comparator further receiving a reset signal for inhibiting the first and second phase difference signals;

a charge pump circuit including first and second transistors connected in series between a power supply and ground, the first phase difference signal being input to the first transistor and the second phase difference signal being input to the second transistor, the charge pump circuit generating the voltage signal at a node between the first and second transistors, wherein the first transistor is in an ON state in accordance with the first phase difference signal and the second transistor is in an ON state in accordance with the second phase difference signal; and a reset circuit detecting the ON state of each of the first and second charge pump transistors and inhibiting the first and second phase difference signals generated by the phase comparator when the first and second charge pump transistors are both in the ON state, wherein the reset circuit includes:

a first detector having a first transistor and a first load resistor connected in series between a power supply and ground, wherein the first phase difference signal is input to the first transistor and a first detector output signal is generated at a node between the first transistor and the first load resistor;

a second detector having a second load resistor and a second transistor connected in series between the power supply and ground, wherein the second phase difference signal is input to the second transistor and a second detector output signal is generated at a node between the second load resistor and the second transistor, and an inverter for inverting the second detector output signal; and a signal generator receiving the first detector output signal and the inverted second detector output signal and generating the reset signal therefrom.

9. The synthesizer of claim 8, wherein the reset circuit first transistor comprises a pMOS transistor and the reset circuit second transistor comprises an nMOS transistor.

10. The synthesizer of claim 8, wherein the reset circuit first transistor is an npn transistor and the reset circuit second transistor is a pnp transistor, and the charge pump first transistor is a pnp transistor and the charge pump second transistor is an npn transistor, the synthesizer further comprising:

a third load resistor connected between the first phase difference signal input to the reset circuit first transistor and the power supply; and a fourth load resistor connected between the second phase difference signal input to the reset circuit second transistor and the ground.

* * * * *